(12) United States Patent
LaBrie et al.

(10) Patent No.: US 11,508,609 B2
(45) Date of Patent: Nov. 22, 2022

(54) WAFER CHUCK ASSEMBLY

(71) Applicant: Lam Research Corporation, Fremont, CA (US)

(72) Inventors: Aaron Louis LaBrie, Sherwood, OR (US); Claudiu Valentin Puha, Aloha, OR (US)

(73) Assignee: Lam Research Corporation, Fremont, CA (US)

( * ) Notice: Subject to any disclaimer, the term of this patent is extended or adjusted under 35 U.S.C. 154(b) by 134 days.

(21) Appl. No.: 17/018,667

(22) Filed: Sep. 11, 2020

(65) Prior Publication Data
US 2020/0411358 A1    Dec. 31, 2020

Related U.S. Application Data

(62) Division of application No. 16/215,608, filed on Dec. 10, 2018, now Pat. No. 10,811,299.
(Continued)

(51) Int. Cl.
*H01L 21/687* (2006.01)
*H01L 21/683* (2006.01)
*H01L 21/68* (2006.01)

(52) U.S. Cl.
CPC .......... *H01L 21/6838* (2013.01); *H01L 21/68* (2013.01); *H01L 21/68728* (2013.01)

(58) Field of Classification Search
CPC ................. H01L 21/6838; H01L 21/68; H01L 21/68728; H01L 21/68785;
(Continued)

(56) References Cited

U.S. PATENT DOCUMENTS 4,788,944 A    12/1988   Rascov
5,566,466 A    10/1996   Hearne
(Continued)

FOREIGN PATENT DOCUMENTS

CN    112368820    2/2021
JP    2014204061 A    10/2014
(Continued)

OTHER PUBLICATIONS

U.S. Appl. No. 16/215,608, Notice of Allowance dated Jun. 10, 2020, 9 pgs.
(Continued)

*Primary Examiner* — Eric A. Gates
*Assistant Examiner* — Paul M Janeski
(74) *Attorney, Agent, or Firm* — Schwegman Lundberg & Woessner, P.A.

(57) ABSTRACT

Some examples provide a vacuum wafer chuck assembly for supporting a wafer. An example chuck assembly comprises a chuck hub and a centering hub disposed within the chuck hub. Chuck arms are mounted to the chuck hub, with each chuck arm extending radially between a proximal end adjacent the chuck hub, and a distal end remote therefrom. A plurality of centering cams is provided, each cam mounted at or towards a distal end of a chuck arm and being movable radially inwardly or outwardly relative to the centering hub to engage or release an edge of a supported wafer in response to a rotational movement of the centering hub. At least one vacuum pad is provided for supporting the wafer during a wafer centering or wafer processing operation.

19 Claims, 19 Drawing Sheets

Related U.S. Application Data

(60) Provisional application No. 62/667,190, filed on May 4, 2018.

(58) Field of Classification Search
CPC ....... H01L 21/68792; H01L 2221/6835; H01L 2221/68381
See application file for complete search history.

(56) References Cited

U.S. PATENT DOCUMENTS

| | | | |
|---|---|---|---|
| 5,851,041 | A | 12/1998 | Anderson et al. |
| 6,578,853 | B1 | 6/2003 | Treur et al. |
| 7,226,055 | B1 | 6/2007 | Bettencourt et al. |
| 7,284,760 | B2 * | 10/2007 | Siebert .............. H01L 21/68707 279/119 |
| 8,172,646 | B2 | 5/2012 | Feng et al. |
| 10,811,299 | B2 | 10/2020 | LaBrie et al. |
| 2002/0153676 | A1 | 10/2002 | Noguchi |
| 2004/0130104 | A1 | 7/2004 | Sundkvist |
| 2005/0031497 | A1 * | 2/2005 | Siebert .............. H01L 21/68707 279/4.12 |
| 2006/0054082 | A1 | 3/2006 | Okuno et al. |
| 2010/0212595 | A1 | 8/2010 | Campaneria, IV et al. |
| 2014/0322919 | A1 | 10/2014 | Stafford et al. |
| 2015/0179495 | A1 * | 6/2015 | Huang .............. H01L 21/68728 29/559 |
| 2017/0294332 | A1 | 10/2017 | LaBrie et al. |
| 2019/0341290 | A1 | 11/2019 | Labrie et al. |
| 2021/0183684 | A1 | 6/2021 | Labrie et al. |

FOREIGN PATENT DOCUMENTS

| | | |
|---|---|---|
| JP | 2021523563 A | 9/2021 |
| WO | WO-2019213533 A1 | 11/2019 |

OTHER PUBLICATIONS

U.S. Appl. No. 16/215,608, Response filed Feb. 12, 2020 to Restriction Requirement dated Dec. 12, 2019, 7 pgs.

U.S. Appl. No. 16/215,608, Restriction Requirement dated Dec. 12, 2019, 6 pgs.

International Application Serial No. PCT/US2019/030616, international Search Report dated Oct. 4, 2019, 3 pgs.

International Application Serial No. PCT/US2019/030616, Written Opinion dated Oct. 4, 2019, 3 pgs.

"International Application Serial No. PCT US2019 030616, International Preliminary Report on Patentability dated Nov. 19, 2020", 5 pages.

* cited by examiner

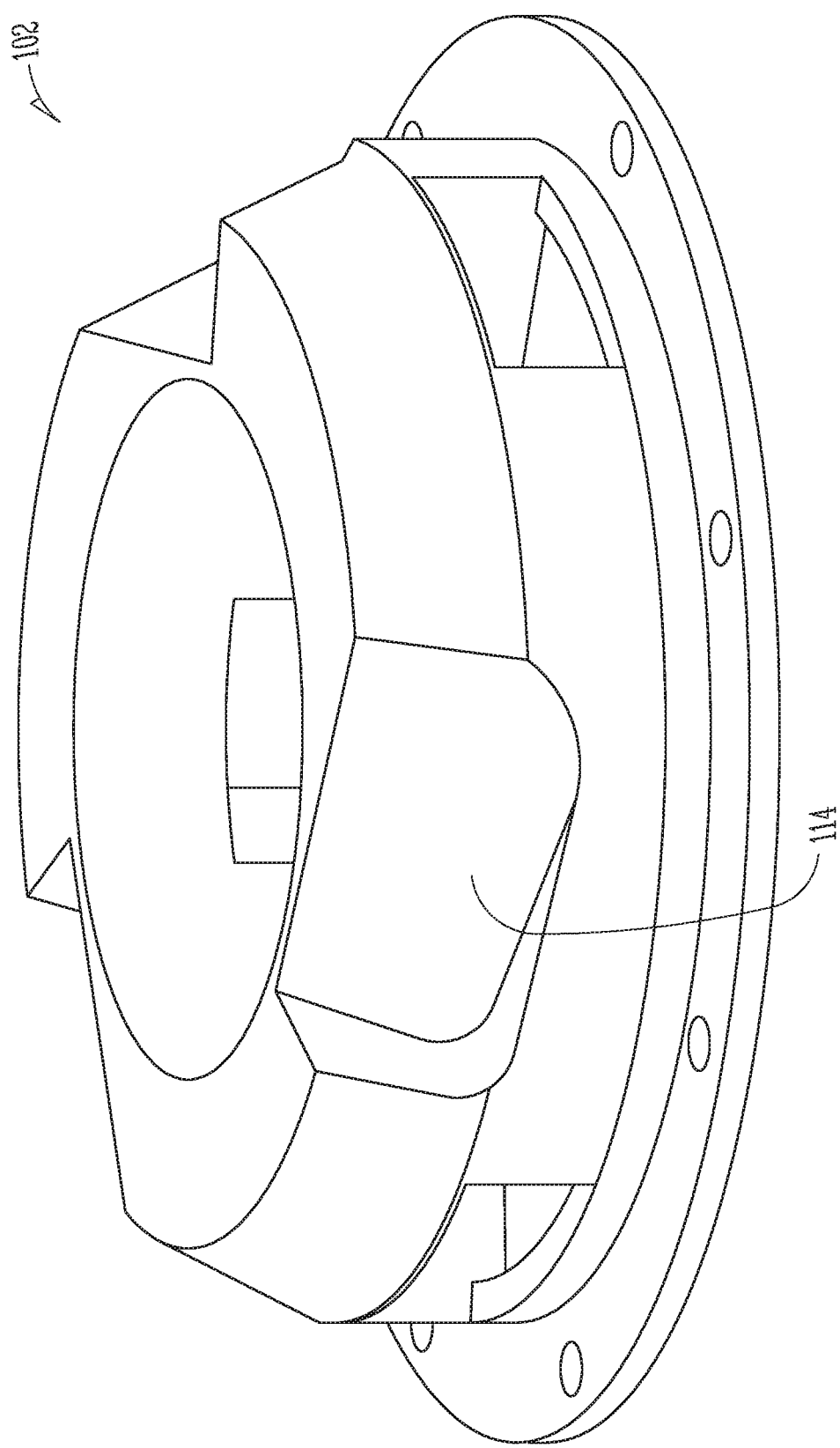

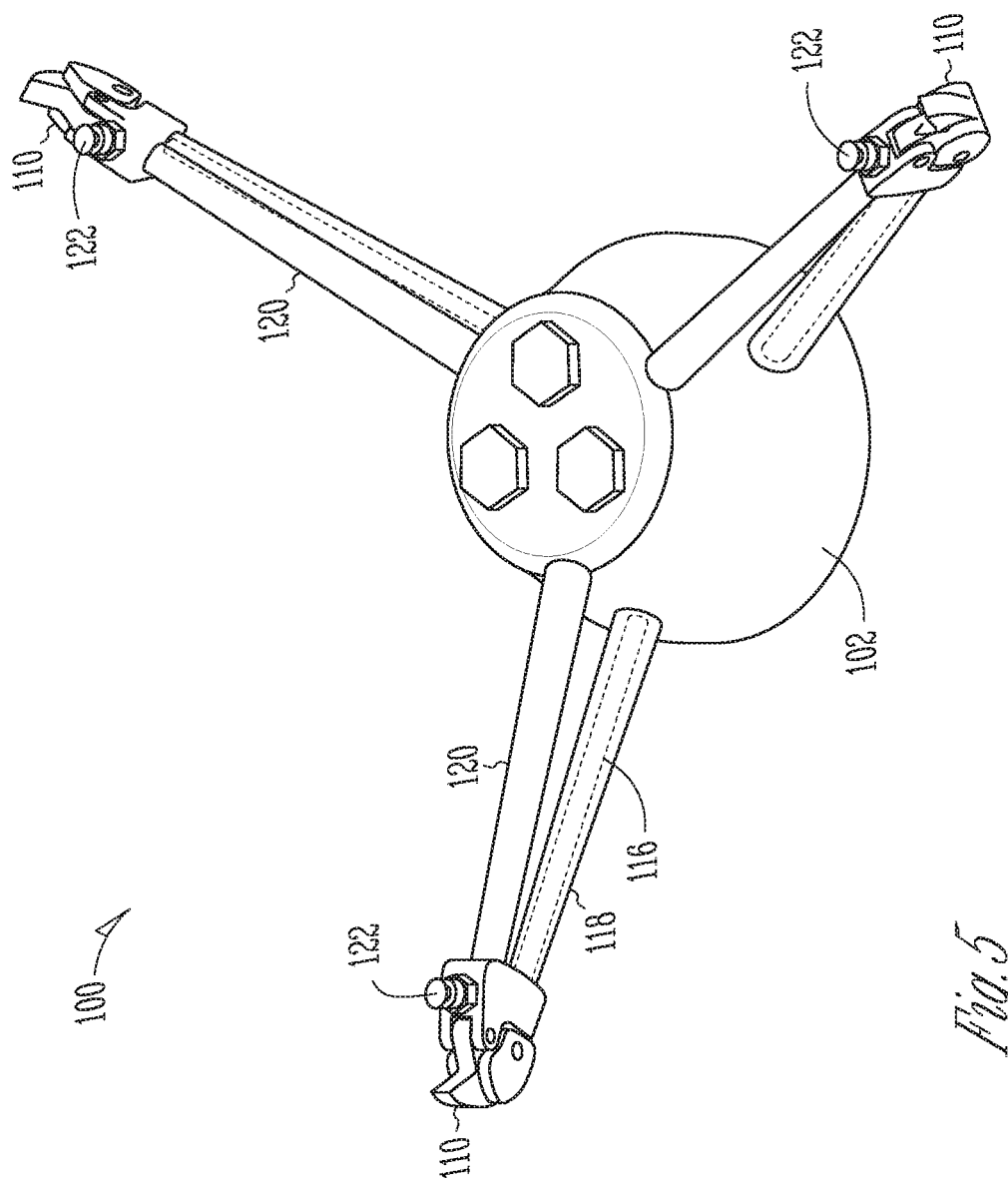

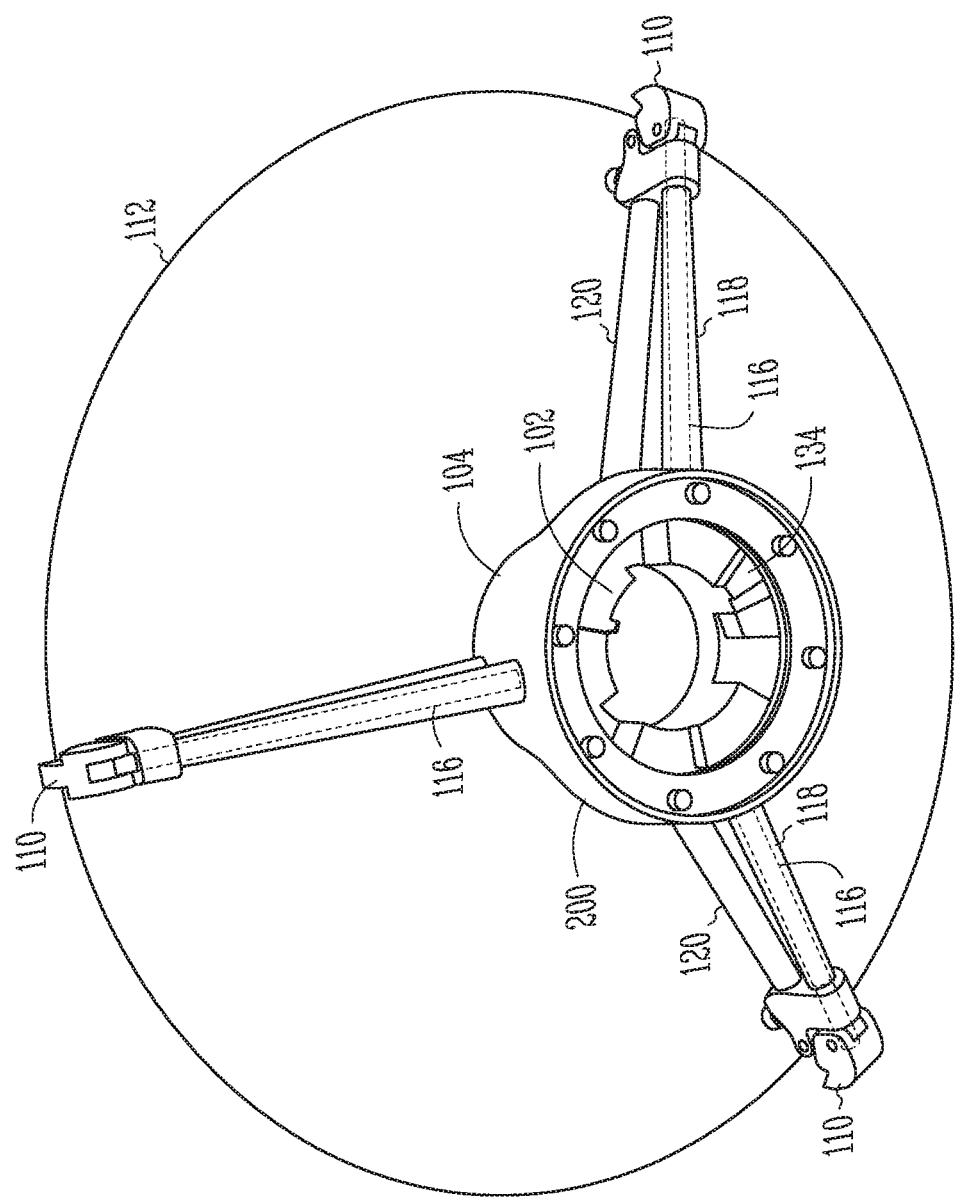

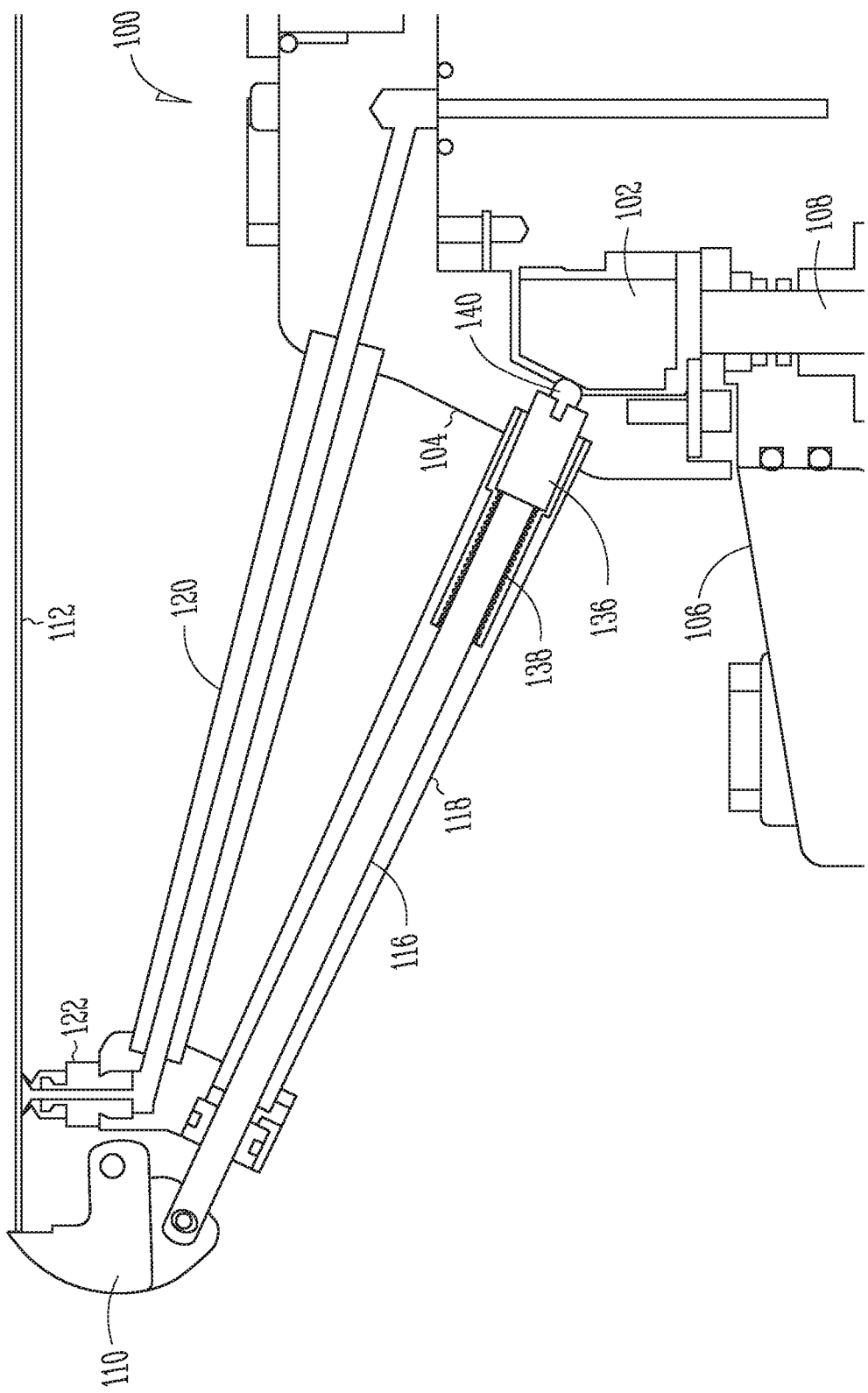

US 11,508,609 B2

WAFER CHUCK ASSEMBLY

CLAIM OF PRIORITY

This application is a divisional of and claims the benefit of priority under 35 U.S.C. § 120 to U.S. patent application Ser. No. 16/215,608, filed on Dec. 10, 2018, which claims the benefit of priority under 35 U.S.C. § 119(e) to U.S. Provisional Patent Application No. 62/667,190, filed on May 4, 2018, which is incorporated by reference herein in its entirety.

FIELD

The present disclosure generally relates to chuck technology for supporting semiconductor wafers during processing. In one embodiment, a vacuum wafer chuck for edge bevel removal (EBR) is provided. In a more specific aspect, this disclosure relates to a post electro-fill module (PEM) chuck for removing unwanted metal such as plating film or a seed layer from an outer edge of a wafer during EBR.

BACKGROUND

The background description provided here is for the purpose of generally presenting the context of the disclosure. Work of the presently named inventors, to the extent that it is described in this background section, as well as aspects of the description that may not otherwise qualify as prior art at the time of filing, are neither expressly nor impliedly admitted as prior art against the present disclosure.

EBR is generally conducted by applying chemicals through a nozzle pointed near a wafer edge while the wafer is being spun. The wafer should be well centered, or concentric, on the chuck to produce uniform EBR results. Existing chucks that use friction pads or passive centering means may not actively center a wafer before an EBR process. This can lead to poor EBR results. Poor EBR results may incur further error if a robot handoff of a wafer to a PEM for example is not precise.

An additional challenge arises when etchants used in an EBR process rebound off peripheral wafer support means, such as Vertical Alignment Pin (VAP) surfaces. The rebounding liquid can interfere with an EBR process and contribute to poor EBR results. This effect can be more pronounced as the edge exclusion (EE) zone decreases. EE typically refers to the amount of material to be removed with reference to the wafer edge.

In further instances, a wafer can sometimes slip on conventional chuck supports during rotation, again leading to poor centering and poor EBR results. Wafer presence detection using external sensors may not always be reliable and can be affected by water droplet splash-back, for example. Splash-back may occur in the manner described above or in other ways during wafer rinsing. Slipping wafers can cut damaging grooves into the cams of chucks which have centrifugal centering cams. This can reduce chuck life and even cause grooved cams to jam against a wafer edge.

COPYRIGHT

A portion of the disclosure of this patent document contains material that may be subject to copyright protection. The copyright owner has no objection to the facsimile reproduction by anyone of the patent document or the patent disclosure, as it appears in the Patent and Trademark Office patent files or records, but otherwise reserves all copyright rights whatsoever. The following notice applies to any data as described below and as shown in the drawings that form a part of this document: Copyright Lam Research Corporation, 2018, All Rights Reserved.

SUMMARY

In some examples, a wafer chuck assembly for supporting a wafer comprises a chuck hub; a centering hub disposed within the chuck hub; an engagement device operable between an engaged position and a disengaged position respectively to engage the chuck hub with the centering hub to prevent relative movement therebetween in one of a clockwise or anticlockwise rotational direction, or to allow relative movement therebetween in either rotational direction; a chuck motor for selectively rotating the chuck hub and/or the centering hub during a wafer processing operation and a wafer centering operation based on an engaged or disengaged position of the engagement device; a plurality of chuck arms mounted to the chuck hub, each chuck arm extending radially between a proximal end adjacent the chuck hub, and a distal end remote therefrom; and a plurality of centering cams each mounted at or towards a distal end of a chuck arm and being movable radially inwardly or outwardly relative to the centering hub to engage or release an edge of a supported wafer in response to a rotational movement of the centering hub relative to the chuck hub.

In some examples, the chuck motor is configured to impart relative rotational movement between the centering hub and the chuck hub during the wafer centering operation. In some examples, the centering hub is fixed relative to the chuck motor during the wafer centering operation, and the chuck motor is configured to cause the chuck hub to rotate in a first rotational direction during the wafer centering operation.

In some examples, the chuck motor is configured to rotate the centering hub and the chuck hub together in a same rotational direction during the wafer processing operation. In some examples, the same rotational direction of the centering hub and the chuck hub during the wafer processing operation is opposite to the first rotational direction of the chuck hub during the wafer centering operation.

In some examples, the centering hub includes at least one camming surface on an exterior surface thereof. In some examples, each chuck arm includes a respective elongate actuation rod operationally disposed between the at least one camming surface of the centering hub, and a centering cam disposed at a distal end of each chuck arm. Each elongate actuation rod may include, at a proximal end thereof, a bearing surface for engaging the at least one camming surface of the centering hub. In some examples, each elongate actuation rod includes, at the distal end thereof, a link with a respective centering cam of a respective chuck arm. In some examples, rotational movement of the centering hub causes a respective camming surface of the centering hub to urge a respective elongate actuation rod radially outwardly, thereby to operate a respective centering cam via the link.

In some examples, the wafer chuck assembly further comprises at least one vacuum pad for supporting a wafer during the wafer centering and/or wafer processing operations. In some examples, the at least one vacuum pad is configured to retain a wafer in a centered position in the wafer chuck assembly at least during the wafer processing operation when the wafer has been released by the plurality of centering cams. In some examples, the at least one vacuum pad is provided on at least one of the plurality of chuck arms. Each of the plurality of chuck arms may comprise a vacuum line for supplying vacuum pressure to the at least one vacuum pad. In some examples, a presence or absence of a vacuum pressure at the at least one vacuum pad is detected and correlated to a presence or absence of a wafer in the wafer chuck assembly, or a presence of a defective wafer.

In some examples, the plurality of centering cams is biased towards an open, wafer-release configuration. In some examples, each centering cam in the plurality of centering cams is movable between a first, wafer-centering position and a second, retracted position, the second retracted position disposed below an upper surface of the wafer supported in the wafer chuck assembly.

In some examples, the wafer chuck assembly further comprises control means for detecting a torque of the chuck motor and correlating the detected chuck motor torque with at least the first, wafer-centering position of the plurality of centering cams. In some examples, the wafer chuck assembly further comprises control means for detecting a torque of the chuck motor and correlating the detected chuck motor torque with a centered position of a wafer held in the wafer chuck assembly. In some examples, the wafer chuck assembly further comprises control means for detecting a torque of the chuck motor and correlating a detected chuck motor torque with a diameter of a wafer held in the wafer chuck assembly.

In other embodiments, a vacuum wafer chuck assembly is provided. An example vacuum wafer chuck assembly comprises a chuck hub; a centering hub disposed within the chuck hub; a plurality of chuck arms mounted to the chuck hub, each chuck arm extending radially between a proximal end adjacent the chuck hub, and a distal end remote therefrom; a plurality of centering cams each mounted at or towards a distal end of a chuck arm and being movable radially inwardly or outwardly relative to the centering hub to engage or release an edge of a supported wafer in response to a rotational movement of the centering hub; and at least one vacuum pad for supporting the wafer during a wafer centering or wafer processing operation.

In some examples, the wafer chuck assembly further comprises an engagement device operable between an engaged position and a disengaged position respectively to engage the chuck hub with the centering hub to prevent relative movement therebetween in one of a clockwise or anticlockwise rotational direction, or to allow relative movement therebetween in either rotational direction; and a chuck motor for selectively rotating the chuck hub and/or the centering hub during a wafer processing operation and a wafer centering operation based on the engaged or disengaged position of the engagement device.

In some examples, the chuck motor is configured to impart relative rotational movement between the centering hub and the chuck hub during the wafer centering operation. In some examples, the centering hub is fixed relative to the chuck motor during the wafer centering operation, and the chuck motor is configured to cause the chuck hub to rotate in a first rotational direction during the wafer centering operation.

In some examples, the chuck motor is configured to rotate the centering hub and the chuck hub together in a same rotational direction during the wafer processing operation. In some examples, the same rotational direction of the centering hub and the chuck hub during the wafer processing operation is opposite to the first rotational direction of the chuck hub during the wafer centering operation.

In some examples, the centering hub includes at least one camming surface on an exterior surface thereof. In some examples, each chuck arm includes a respective elongate actuation rod operationally disposed between the at least one camming surface of the centering hub, and a centering cam disposed at a distal end of each chuck arm of the plurality of centering cams. In some examples, each elongate actuation rod includes, at a proximal end thereof, a bearing surface for engaging the at least one camming surface of the centering hub. In some examples, each elongate actuation rod includes, at the distal end thereof, a link with a respective centering cam of a respective chuck arm.

In some examples, rotational movement of the centering hub causes a respective camming surface of the centering hub to urge a respective elongate actuation rod radially outwardly, thereby to operate a respective centering cam via the link.

In some examples, the at least one vacuum pad is configured to retain the wafer in a centered position in the wafer chuck assembly at least during the wafer processing operation when the wafer has been released by the plurality of centering cams. In some examples, the at least one vacuum pad is provided on at least one of the plurality of chuck arms. In some examples, each of the plurality of chuck arms comprises a vacuum line for supplying vacuum pressure to the at least one vacuum pad. In some examples, a presence or absence of a vacuum pressure at the at least one vacuum pad is detected and correlated to a presence or absence of the wafer in the wafer chuck assembly, or a presence of a defective wafer.

In some examples, the plurality of centering cams is biased towards an open, wafer-release configuration. In some examples, each centering cam in the plurality of centering cams is movable between a first, wafer-centering position and a second, retracted position, the second retracted position disposed below an upper surface of the wafer supported in the wafer chuck assembly.

In some examples, the wafer chuck assembly further comprises control means for detecting a torque of the chuck motor and correlating the detected chuck motor torque with at least the first, wafer-centering position of the plurality of centering cams. In some examples, the wafer chuck assembly further comprises control means for detecting a torque of the chuck motor and correlating the detected chuck motor torque with a centered position of the wafer held in the wafer chuck assembly. In some examples, the wafer chuck assembly further comprises control means for detecting a torque of the chuck motor and correlating the detected chuck motor torque with a diameter of the wafer held in the wafer chuck assembly.

In other embodiments, a wafer chuck assembly is provided for supporting a wafer. An example wafer chuck assembly comprises a chuck hub; a centering hub disposed within the chuck hub; a chuck motor for selectively rotating the chuck hub or the centering hub during a wafer processing operation or a wafer centering operation; a plurality of chuck arms mounted to the chuck hub, each chuck arm extending radially between a proximal end adjacent the chuck hub, and a distal end remote therefrom; a plurality of centering cams each mounted at or towards a distal end of a chuck arm and being movable radially inwardly or outwardly relative to the centering hub to engage or release an edge of a supported wafer in response to a rotational movement of the centering hub relative to the chuck hub; and control means for detecting a torque of the chuck motor and correlating the detected chuck motor torque with at least a first, wafer-centering position of the plurality of centering cams.

In some examples, the wafer chuck assembly further comprises an engagement device operable between an engaged position and a disengaged position respectively to engage the chuck hub with the centering hub to prevent relative movement therebetween in one of a clockwise or anticlockwise rotational direction, or to allow relative movement therebetween in either rotational direction, and wherein the chuck motor selectively rotates the chuck hub or the centering hub during a wafer processing operation or a wafer centering operation based on the engaged or disengaged position of the engagement device.

In some examples, wherein the control means detect a torque of the chuck motor and correlate the detected chuck motor torque with a centered position of the wafer held in the wafer chuck assembly. In some examples, the control means detect a torque of the chuck motor and correlate the detected chuck motor torque with a diameter of the wafer held in the wafer chuck assembly.

DESCRIPTION OF THE DRAWINGS

Some embodiments are illustrated by way of example and not limitation in the views of the accompanying drawings.

FIG. 2 includes a pictorial view of a centering hub, according to an example embodiment.

FIG. 5 includes a pictorial view of an upper side of a chuck assembly, according to an example embodiment.

FIG. 6 includes a pictorial view of an underside of a chuck assembly holding a wafer, according to an example embodiment.

FIG. 11 includes a sectional view of the example chuck assembly of FIG. 10, with the stopper pin up and the cam in an up or centering wafer position, according to example embodiments.

SUMMARY

Description

The description that follows includes systems, methods, techniques, instruction sequences, and computing machine program products that embody illustrative embodiments of the present disclosure. In the following description, for purposes of explanation, numerous specific details are set forth in order to provide a thorough understanding of example embodiments. It will be evident, however, to one skilled in the art that the present inventive subject matter may be practiced without these specific details.

In one example, a centering chuck assembly is provided. The chuck assembly includes retractable gripping cams (or clamps) for centering a wafer held by the chuck assembly, as described more fully below. Some example wafer chuck assemblies include vacuum pads for improved wafer grip and engagement adaptability in the chuck. The chuck assembly can actively center a wafer after the wafer is placed therein. A wafer may be placed into a chuck assembly by a robot before processing, for example, in an EBR process. Wafer centering is possible in other applications.

As discussed above, accurate and secure wafer centering in a chuck assembly (also termed a chuck herein, where applicable) can be important for attaining high EBR quality. In some examples of the present disclosure, a chuck assembly comprises vacuum pads to which a vacuum can be applied to secure an element, such as a substrate or wafer, thereto. In some examples, the chuck assembly further comprises centering cams that retract horizontally below an upper surface of a wafer placed in the chuck assembly while a vacuum is applied to the vacuum pads to hold the wafer in place. The absence of peripheral structures by dint of the downwardly retracted cams removes splash-back surfaces that might otherwise cause the rebound of EBR chemicals or water onto the wafer surface. This arrangement thus substantially eliminates a significant contributor to the poor EBR results and disadvantages discussed above.

In some examples of the present chuck assembly, high wafer grip forces can be generated. In some examples, a wafer can be vacuum gripped in place by a grip force over six times higher than that of conventional friction pads which have the same diameter. In some examples, the presence or location of a wafer in a chuck assembly is detected or measured in association with vacuum clamping. For example, the underside of a placed wafer might seal off a vacuum pad within the chuck and allow a vacuum to develop or be applied to the wafer in a gradual or stepwise manner. The mere fact that a vacuum can be applied might signify that a wafer is present in the chuck. In other examples, a low vacuum pressure may signify that a wafer is not present in the chuck or is misplaced in some way. A high vacuum pressure may indicate a good wafer placement.

Figure 1A:
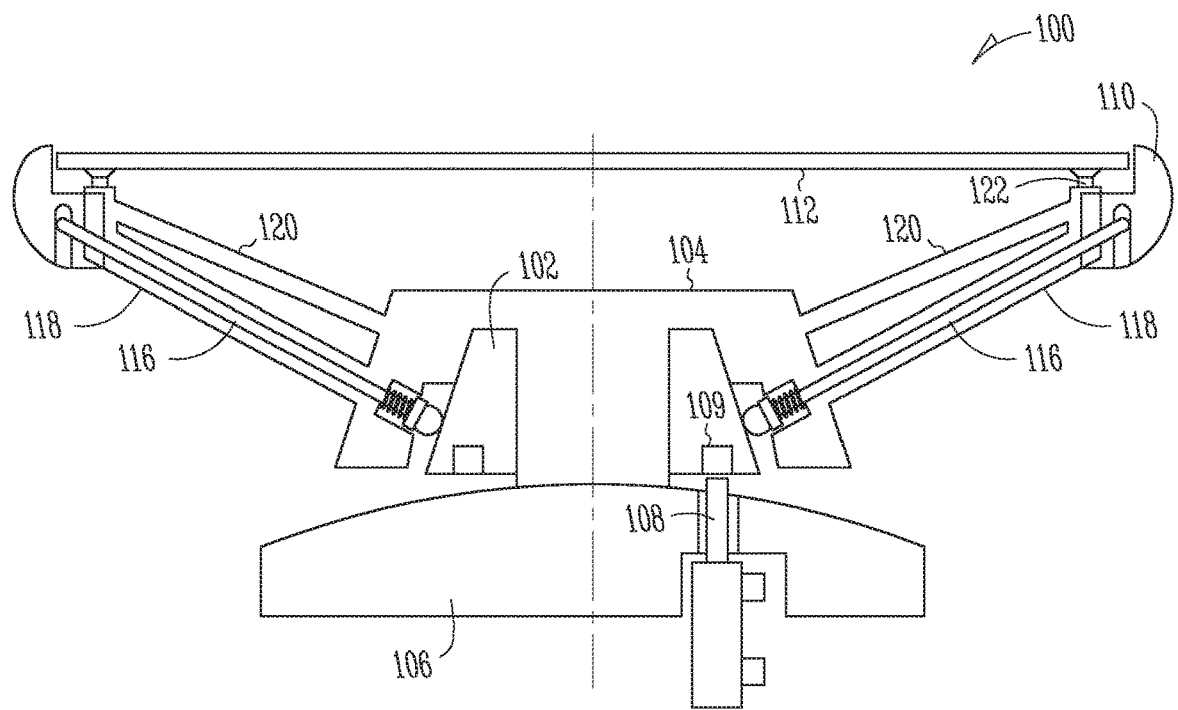
FIGS. 1A-1B include schematic sectional diagrams of aspects of a chuck assembly, according to an example embodiment.
Figure 1B:
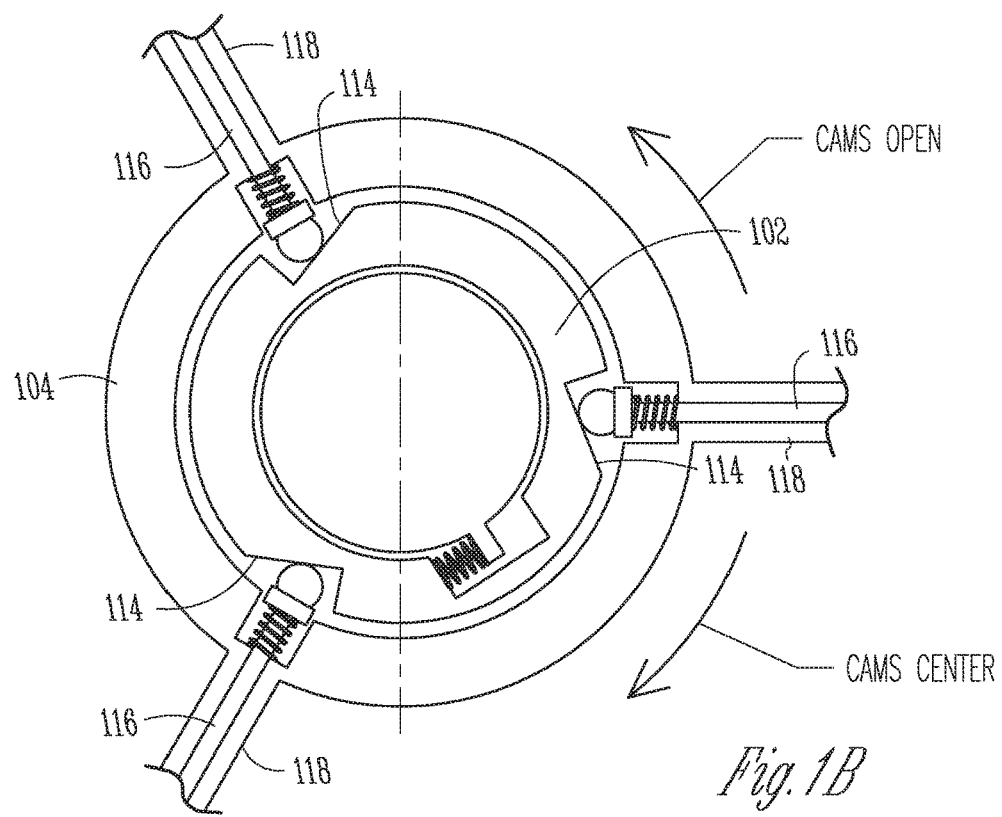

Reference is now made to FIGS. 1A-1B. These figures include schematic sectional views of an example chuck assembly 100. A centering hub 102 is disposed within a chuck hub 104. The centering hub 102 can rotate independently of the chuck hub 104, but spins in the same direction as the chuck hub 104 under a normal spinning operation during wafer processing, for example. The normal spinning operation may be clockwise, for example. A pictorial view of an example centering hub 102 is shown in FIG. 2. As shown, the centering hub 102 includes a series of camming surfaces 114 which bear against the ends of actuating push rods 116 as described more fully below.

In a wafer centering operation, the centering hub 102 is locked to a chuck spindle 106 by a locking pin 108 that can be pushed upwardly into a recess 109 in the centering hub 102. The centering hub 102 thus becomes a fixture, as it were. The chuck assembly 100 can then be rotated the other way (for example, anticlockwise) so that there is relative rotational movement between the centering hub 102 and the chuck hub 104. Relative rotational movement between the slowly rotating centering hub 102 and the chuck hub 104 causes the camming surfaces 114 of the centering hub 102, as shown in FIG. 1B, to urge the actuating push rods 116 outwardly to rotate cams 110, as shown. In some examples, the actuating push rods 116 are movably located within hollow chuck arms 118. In some examples, the cams 110 are kinematically linked to accommodate different diameters of a wafer 112. Three cams 110 are shown. Other numbers and configurations of cams are possible.

In some examples, a chuck spindle 106 motor torque is monitored, and a spike in the motor torque indicates that the cams 110 are fully closed against the edge of the wafer 112 to signify that the wafer 112 is centered. The centering hub 102 may be radially spring loaded as shown to release the cams 110 and free the wafer 112 when rotation stops, or when the chuck assembly 100 slows down. In some examples, the arrangement is such that the chuck hub 104 remains stationary during wafer centering while the centering hub 102 is rotated within it to operate the cams 110. In other examples, neither the centering hub 102 nor the chuck hub 104 is stationary during centering, but counter-rotational movement between these components is still provided such that the cams 110 remain operable and can close and open. In some examples, one or more sensors monitor a position of the locking pin 108. The chuck spindle 106 motor may be used for both spinning and centering.

Some examples of a chuck assembly 100 include vacuum supply lines 120. In FIG. 1A, vacuum supply lines 120 supply vacuum (or negative pressure) to vacuum pads 122 that support the wafer 112. In some examples, the hollow chuck arms 118 are radially aligned with the vacuum supply lines 120 to minimize profile and reduce the possible backsplash of rinsing agents during EBR.

Figure 3:
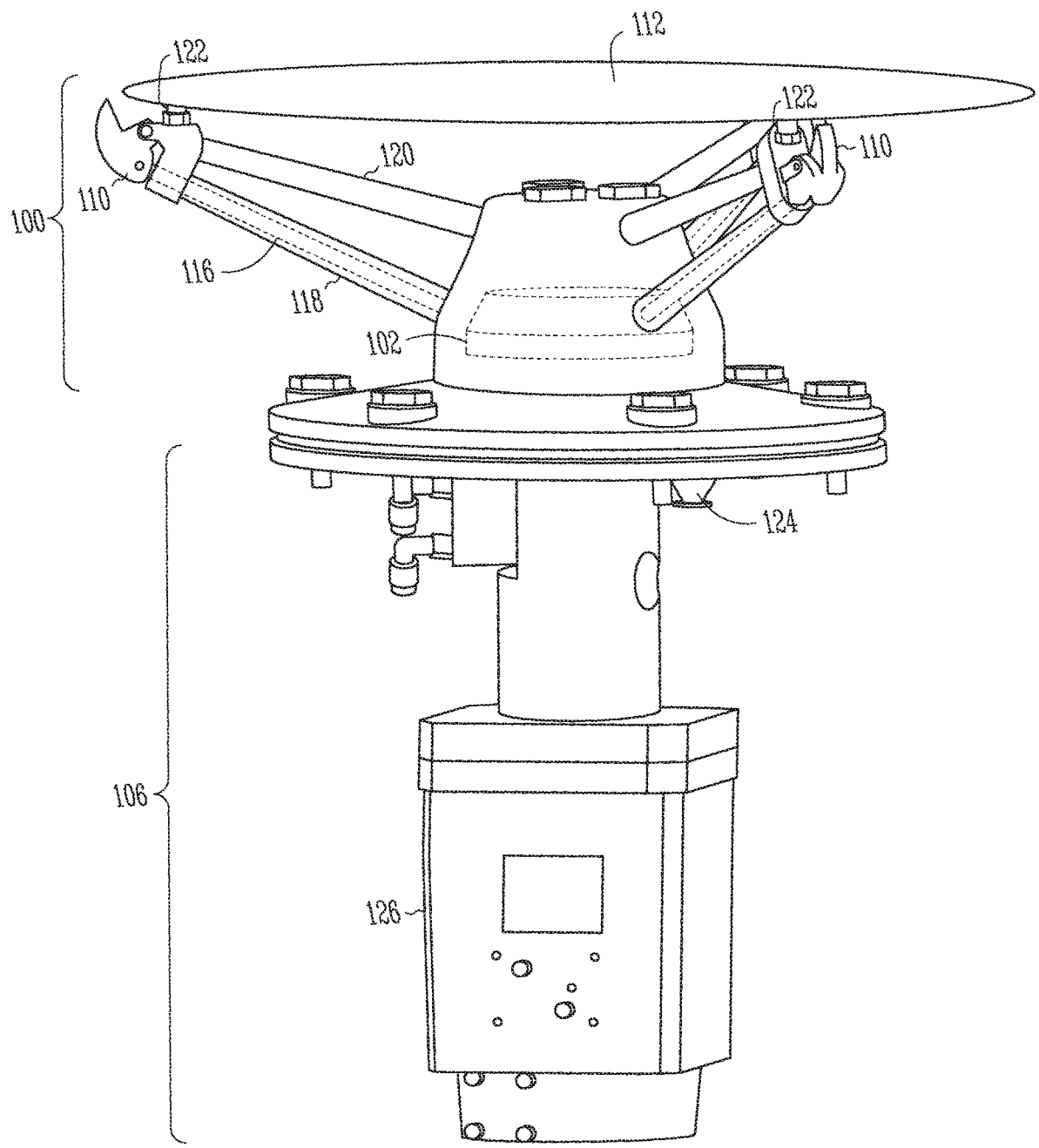
FIG. 3 includes a pictorial view of a chuck assembly mounted on a spindle assembly, according to an example embodiment.

FIG. 3 includes a pictorial view of a chuck assembly 100 with some internal components shown in ghosted outline. Components corresponding to those discussed above are labeled with the same numerals. A chuck assembly 100, a chuck spindle 106, a spindle motor 126, and a vacuum supply fitting 124 to a rotary union (visible in FIG. 4A) are generally shown.

Figure 4A:
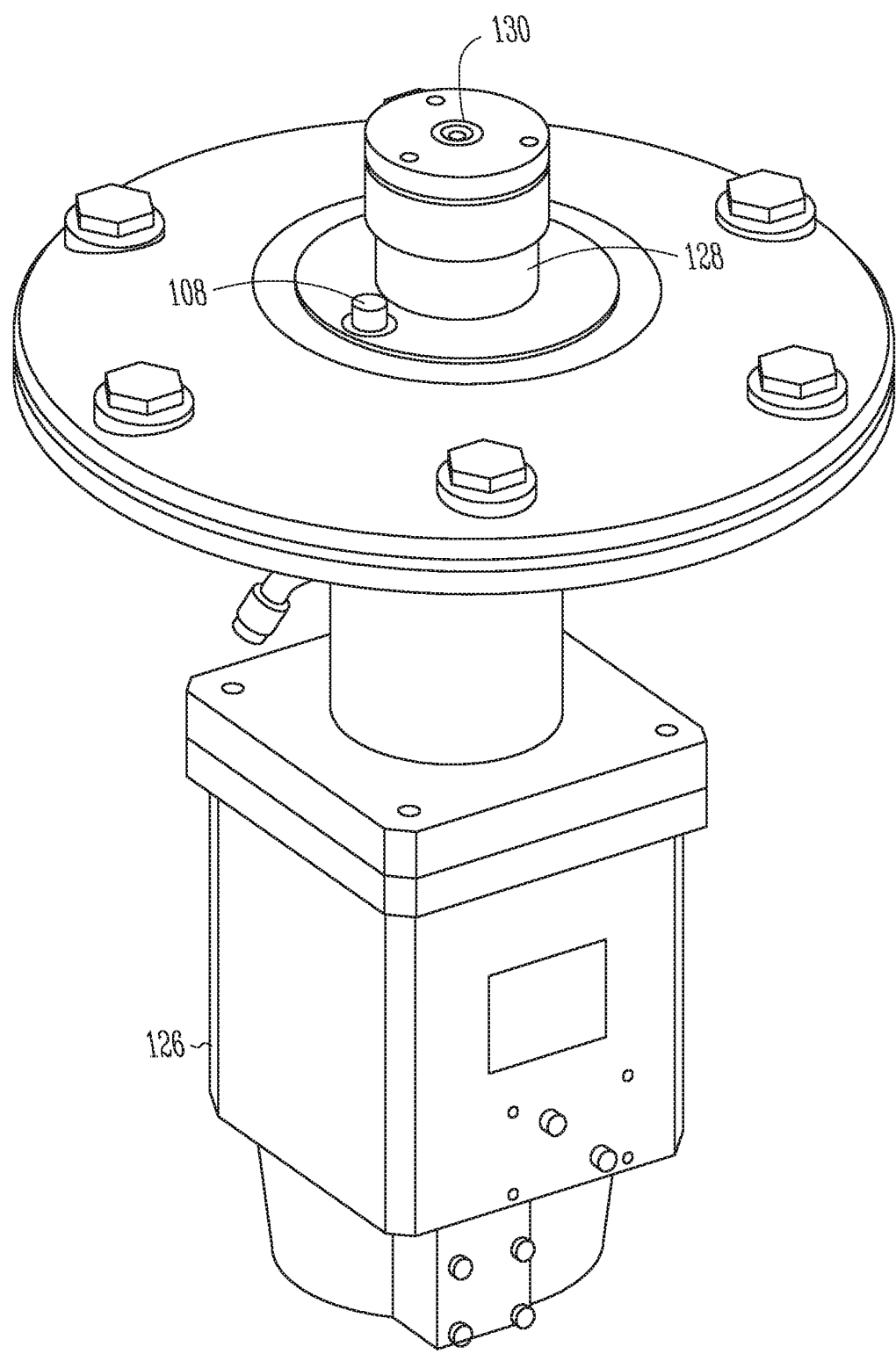
FIGS. 4A-4B include pictorial views of a chuck spindle assembly and vacuum supply components, according to example embodiments.
Figure 4B:
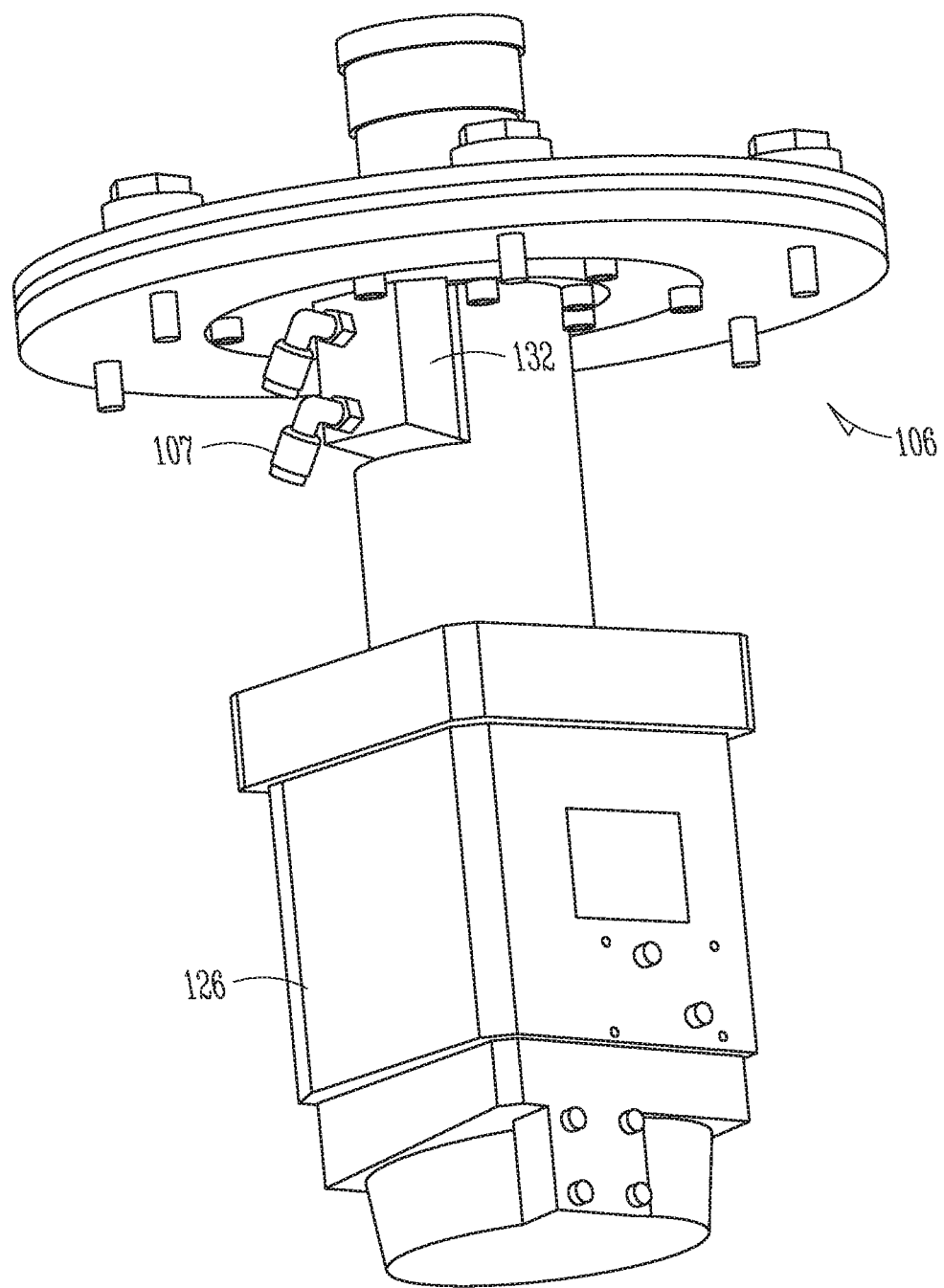

FIGS. 4A-4B show further pictorial views of the chuck spindle 106 assembly and vacuum supply. The illustrated rotary union 128 passes vacuum up to the vacuum lines of the chuck in a manner somewhat analogous to a slip ring passing current to coils in an electric motor, and a correspondingly sized O-ring 130 seals off the vacuum circuit to the chuck assembly 100. The view in FIG. 4A also shows a locking pin 108 in an up or locked position to engage the centering hub 102 with the chuck spindle 106. A pneumatic air supply 107 for a drive cylinder 132 that drives the locking pin 108 is visible in FIG. 4B.

In some examples, the chuck spindle motor 126 has encoder or indexing ability such that the precise rotational position of the motor, or a component fitted to it, can be ascertained. In some examples, a motor or chuck has a 20-bit encoder with 1.04 million detectable positions per revolution fitted to it. The encoding information, coupled with motor torque information, can be used to run self-diagnostic tests as discussed more fully below. For example, if a motor torque spike occurs at an unexpected rotational position, this may indicate that a centering error has occurred. Alternatively, a diameter of a wafer 112 may be derived based on the occurrence or position of a spindle motor 126 torque spike, since the cams 110 will stop moving and offer resistance when they touch the circumference of the wafer 112. A window of acceptable torque spikes may be established.

In some examples, the degree to which a cam 110 at the outer end of a chuck arm 118 rotates to grip the edge of a wafer 112 is proportional to the extent to which the centering hub 102 has been rotated to induce that cam 110 rotation. A rotational position of the centering hub 102 may be derived and measured based on the corresponding, indexed rotational position of the spindle motor 126. The cams 110 and centering hub 102 are directly interconnected via the actuating push rods 116. In some examples, a rotational position of the centering hub 102 is correlated with a radial or clamping position of the cams 110. The rotational position, or a change in motor position, is detected by an encoder and derived accordingly. This is then mapped to a radial position of a centering clamp.

In some examples, the diameter of a wafer 112 placed in the chuck cams 110 is established from an encoded rotational position of the spindle motor 126, since a motor torque spike may be expected at the moment the cams 110 engage with the edge of the wafer 112 placed between them. The rotational position of the centering hub 102 at which a motor spike is detected is correlated to a radial position of a cam 110 (or all three of them), and the diameter of a wafer 112 gripped between them is derived, as that radial position corresponds to an outer edge of the wafer 112. In some examples of the present chuck, calculated or measured interrelationships between aspects such as motor torque, encoder position, wafer presence, wafer diameter, and vacuum pressure (or absence of the same) are utilized in certain method embodiments discussed further below.

FIG. 5 includes a pictorial view of a top side of a chuck assembly 100, in accordance with example embodiments. Components corresponding to those described above are labeled with corresponding numerals. When activated, vacuum pads 122 can grip a wafer placed in the chuck assembly 100 in association with or without the cams 110. The cams 110 can center a wafer as described above. Tubular chuck arms 118 house push rods 116 for operating the cams 110. Vacuum supply lines 120 transport vacuum from a rotary union, for example as described above, to the vacuum pads 122.

FIG. 6 includes a pictorial view of an underside of the example chuck assembly 100 shown in FIG. 5. In this view, a centering hub abutment or fin 134 is visible. In the illustrated example, the fin 134 is formed integrally with the centering hub 102. Other arrangements are possible. The fin 134 is selectively engageable by a locking pin 108 to initiate a wafer centering operation as described further above.

Initial relative rotational movement in one direction between the illustrated chuck hub 104 (for example, stationary in this example) and the centering hub 102 causes the cams 110 to close to center and grip a wafer 112 gripped between them. Once the cams 110 are closed, no further relative rotational movement between the centering hub 102 and chuck hub 104 is possible, the spindle motor 126 torque spikes to indicate wafer 112 centralization and securement, and then, driven by the chuck spindle 106, both the hub and the chuck are sped up in the opposite direction to their operative rotational velocity. At high process speeds, and in view of the high centripetal forces generated and degree of accuracy typically required, it is important for a wafer 112 to be held securely and concentrically in the chuck assembly 100.

Figure 7:
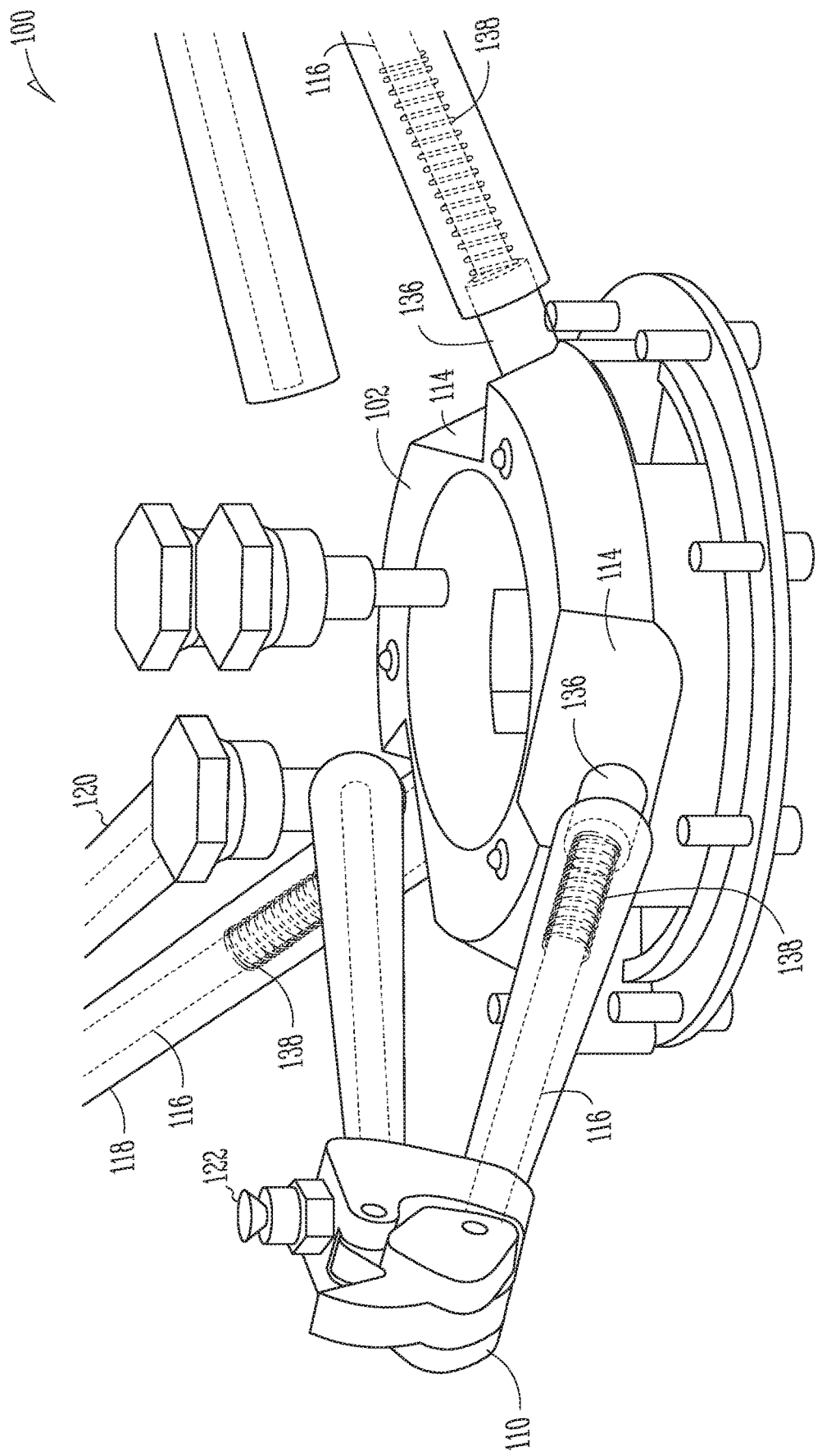
FIG. 7 includes a pictorial view of a centering hub and associated components of a chuck assembly, according to example embodiments.

FIG. 7 shows further details of an example chuck assembly 100. Here, a centering hub 102 is again shown. When the centering hub 102 is rotated, camming surfaces 114 of the centering hub 102 act on spring-loaded ball plungers 136 provided at the lower end of each push rod 116. The upper end of each push rod 116 actuates a rotatable cam 110 which rotates accordingly to grip a wafer 112 placed between them. A vacuum pad 122 is shown adjacent a cam 110 in the view. The push rods 116 move radially outwardly when urged in that direction by the camming surfaces 114 of the rotating centering hub 102 moving, for example, in a clockwise direction in the view. The push rods 116 can be withdrawn by the centering hub 102 rotating in the other direction so that the cams 110 are retracted.

When moving outwardly, the push rods 116 cause their respective cams 110 disposed at the upper end of each push rod 116 to rotate, thereby to grip and center a wafer 112 held in the chuck. If a vacuum source is actuated, the vacuum pads 122 grip the underside of the wafer 112, and the cams 110 may be retracted accordingly, as the wafer 112 is still securely held in place by the vacuum pads 122. With the vacuum pads 122 holding a wafer 112 in place, the cams 110 may be retracted fully below the upper surface of the wafer 112 to allow a clean and unobstructed upper surface of the wafer 112 to be presented during EBR procedures or other processing. The ability of the cams 110 to retract fully can provide at least some of the benefits described further above.

In the illustrated example, the push rods 116 are biased inwardly by springs 138, and the cams 110 are therefore biased openly until they are closed by an outward movement of the push rods 116. The biased-open spring-loading of the illustrated chuck assembly 100 allows the cams 110 to retract and release a wafer 112 when the centering hub 102 is rotated counter-clockwise relative to the chuck hub 104. The arrangement defaults to a wafer-release configuration.

Figure 8:
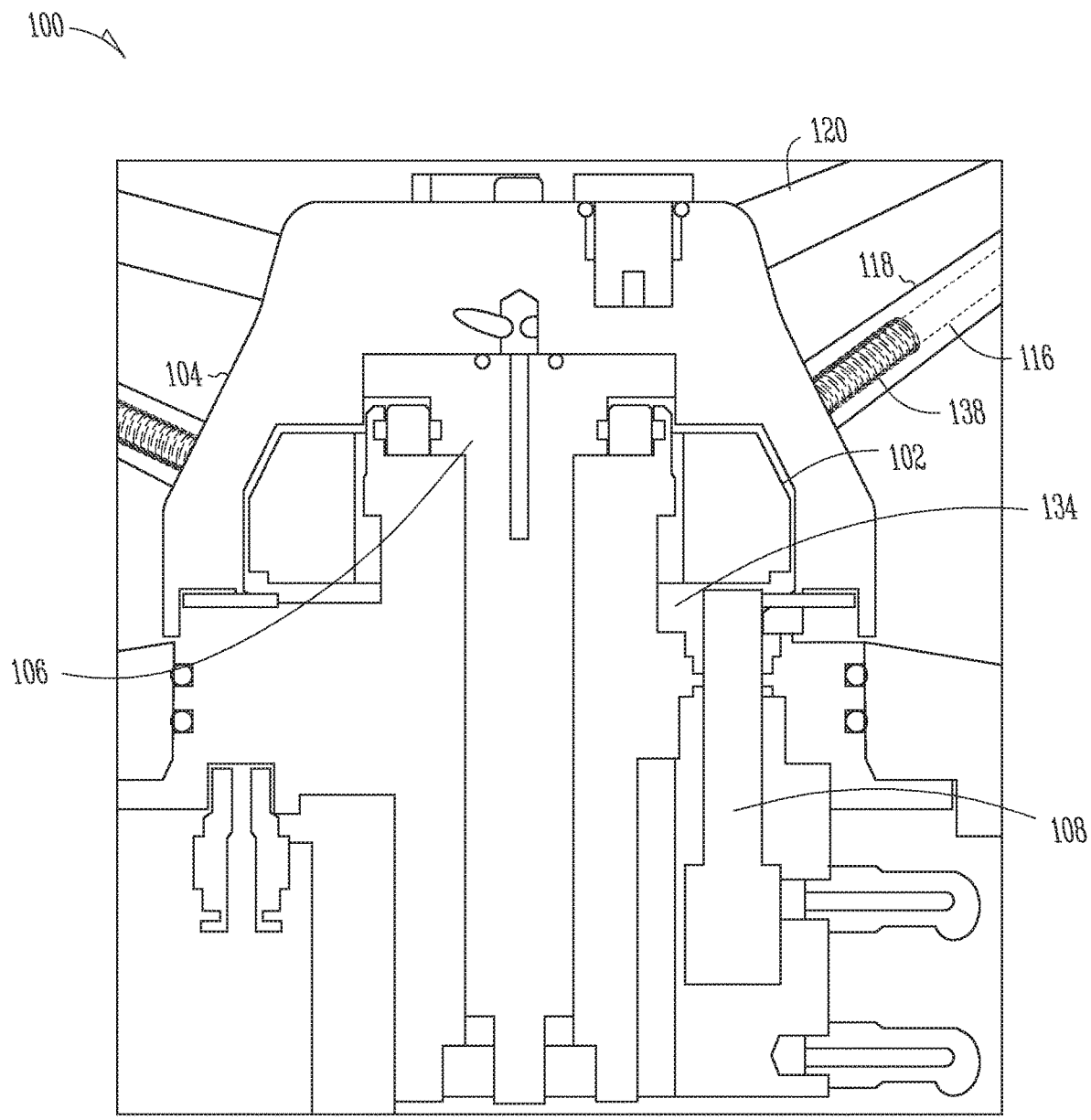
FIG. 8 includes a sectional view of a chuck assembly fitted to the head of a chuck spindle assembly, according to example embodiments.

FIG. 8 includes a sectional view of a chuck assembly 100 fitted to the head of a chuck spindle 106 assembly. In this view, a locking pin 108 is seen in an up or locked position. A centering hub abutment or fin 134 engages a side wall of the locking pin 108 when the locking pin 108 is up and the chuck hub 104 is rotated counter-clockwise as viewed from above. Rotational movement of the centering hub 102 is prevented by the locking pin 108, and relative rotational motion between the chuck hub 104 (carrying the push rods 116) and the locked centering hub 102 is allowed. The camming motion induced by the relative rotational movement between the chuck hub 104 and the centering hub 102 causes the push rods 116 to move outwardly, causing the cams 110 to close as described above.

Figure 9:
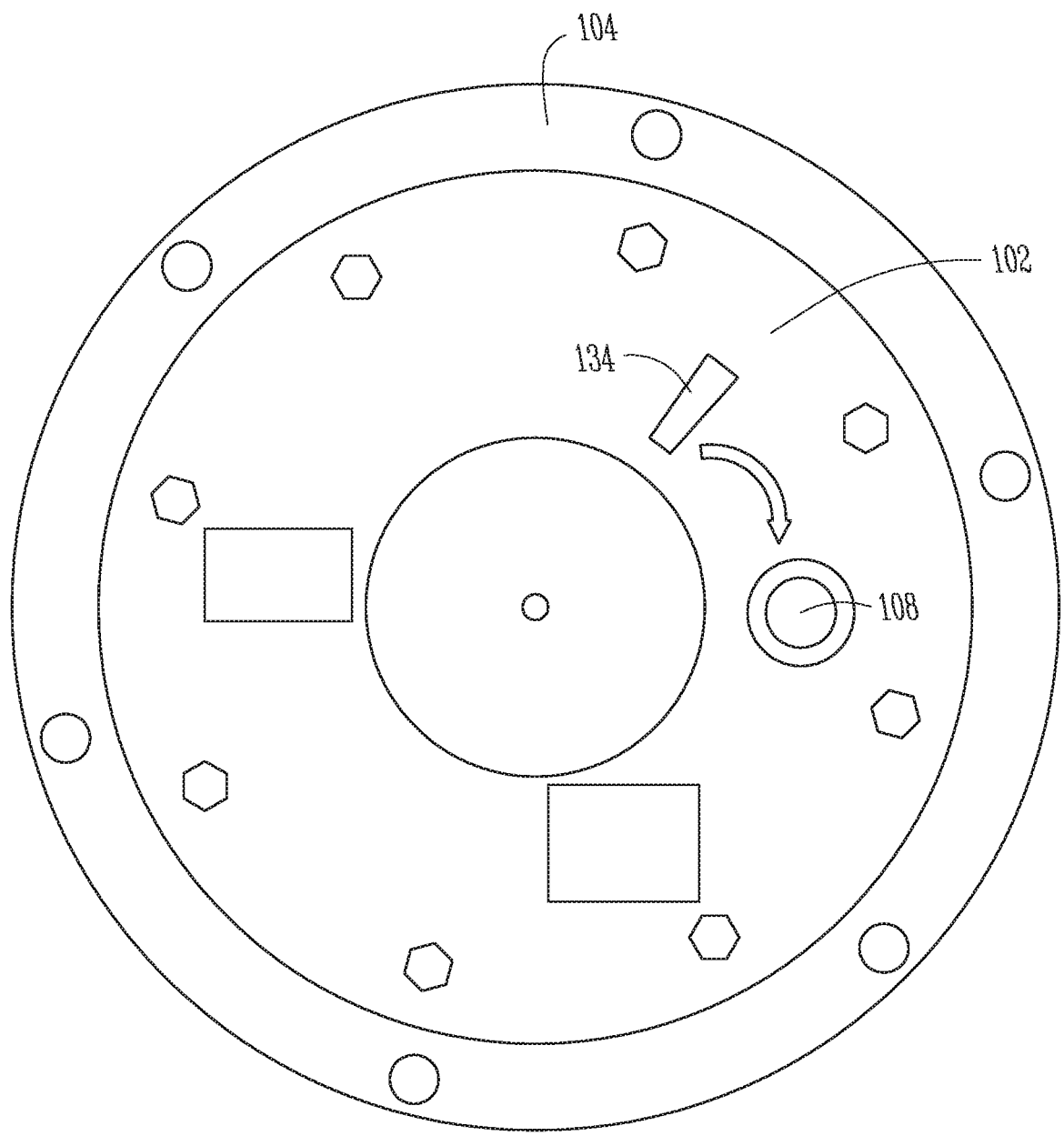
FIG. 9 includes a pictorial view of an arrangement of an engagement fin and locking pin, according to an example embodiment.

In FIG. 9, a pictorial view of an example centering hub fin 134 is shown arranged on the underside of an example centering hub 102. A locking pin 108 engages the fin 134 when the locking pin 108 is extended (up). When the locking pin 108 is retracted (down), the centering hub 102 can spin freely in either direction, but typically will spin most often in the direction used when rotating at very high speeds during wafer processing. The locking pin 108 is actuated by a locking drive cylinder 132, as mentioned above. The locking pin 108 and drive cylinder 132 do not rotate and are fixtures. When the locking pin 108 is extended (up), it engages with the centering hub fin 134 and locks the centering hub 102 against rotational movement in the locked direction. The centering hub 102 is thus fixed relative to earth against rotational movement at least in the direction blocked by the locking pin 108. When the chuck hub 104 is counter-rotated slowly over the stationary centering hub 102 positioned below it by the spindle motor 126, the actuating push rods 116 carried by the chuck hub 104 are pushed out by the camming surfaces 114, causing the cams 110 to operate and center a wafer 112 held between them in the manner described above. Vacuum is applied to the vacuum pads 122 which grip the underside of the wafer 112 in the centered position. The locking pin 108 can then be retracted so that the chuck hub 104 can be spun up to processing speeds (operational velocity) by the spindle motor 126 in a direction opposite to the locking direction.

Figure 10:
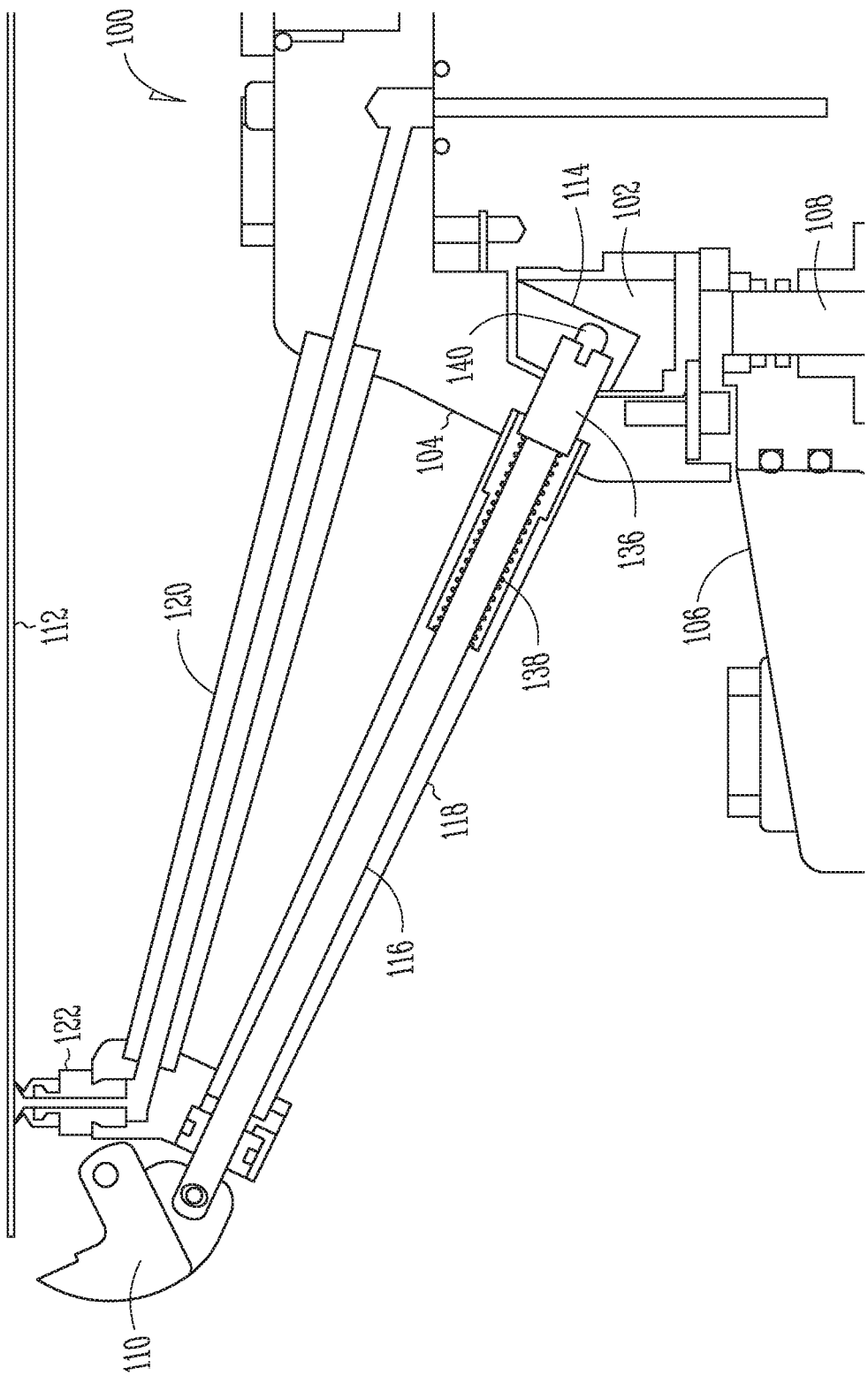
FIG. 10 includes a sectional view of a chuck assembly with a stopper pin retracted and a cam in a down position, according to example embodiments.

FIG. 10 includes a sectional view of a chuck assembly 100 spinning at operational velocity. The illustrated configuration of the chuck assembly is known as being "at home." In this mode, the cams 110 of the chuck assembly 100 are in a retracted or downward position, as shown. The wafer 112 is held in place by (negative) vacuum pressure applied through the vacuum pads 122. The locking pin 108 is in a retracted or down position, as shown. A bearing contact 140 is provided at the lower end of each actuating push rod 116. In the mode shown, the bearing contact 140 is disposed at the "deepest" (most inward) position on the camming surface 114 of the centering hub 102 against which the bearing contact 140 acts in use. FIG. 11 includes a similar sectional view of a chuck assembly 100, but in this case the cams 110 are extended or in an upward position to center a wafer 112 held between them. In the mode shown, the bearing contact 140 is disposed at the "shallowest" (most outward) position on the camming surface 114 of the centering hub 102 against which the bearing contact 140 acts in use.

Figure 12A:
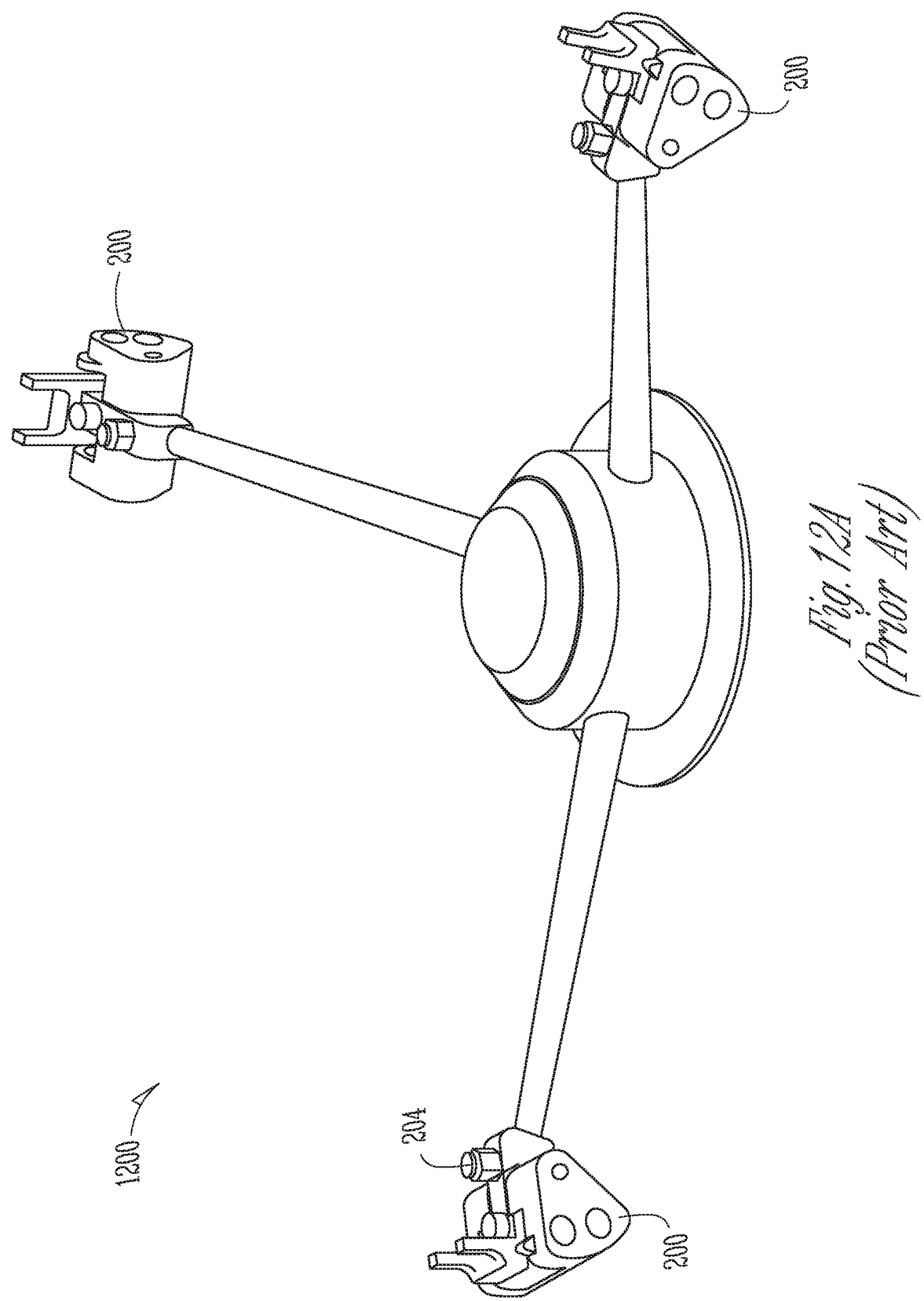
FIGS. 12A-12B include pictorial views of conventional chuck components, according to example embodiments.
Figure 12B:
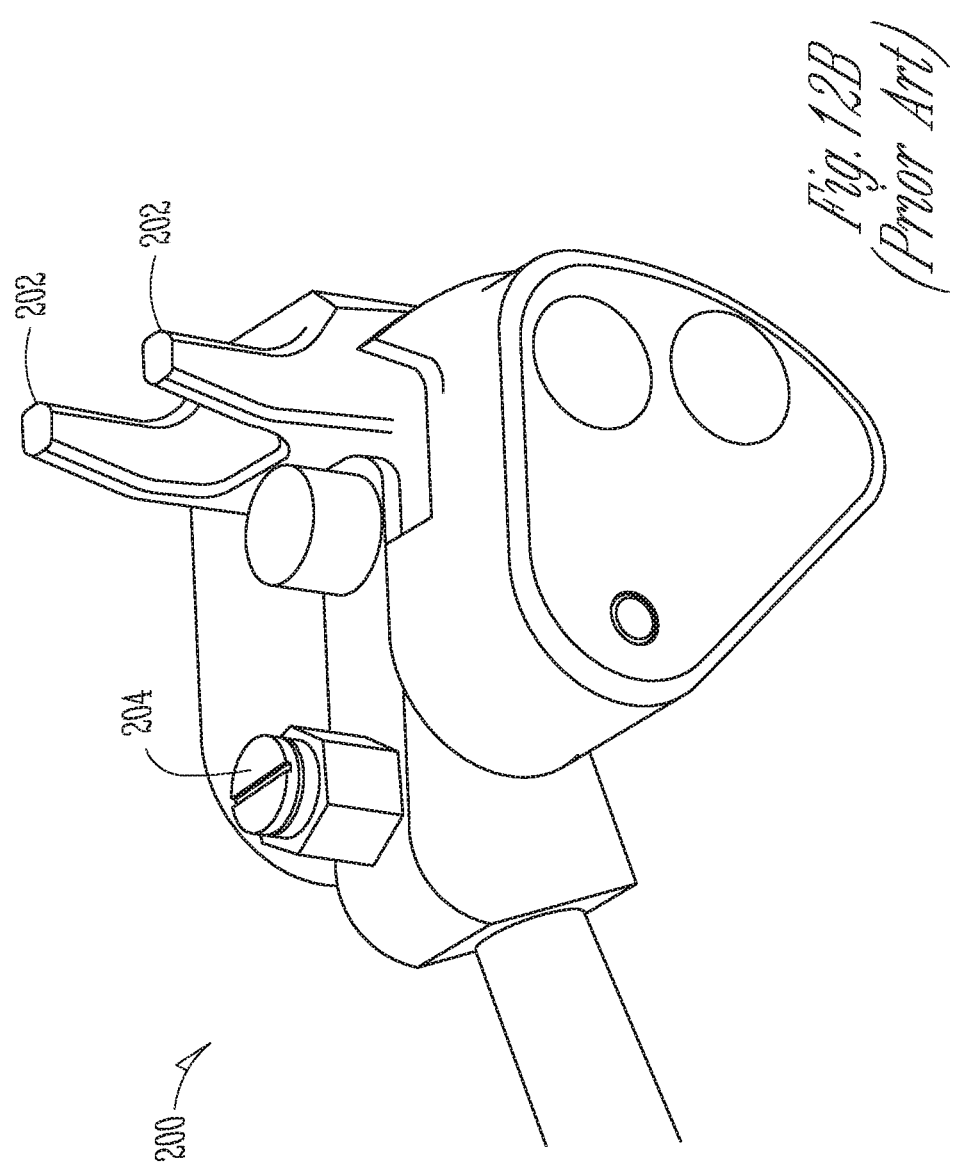
Figure 12C:
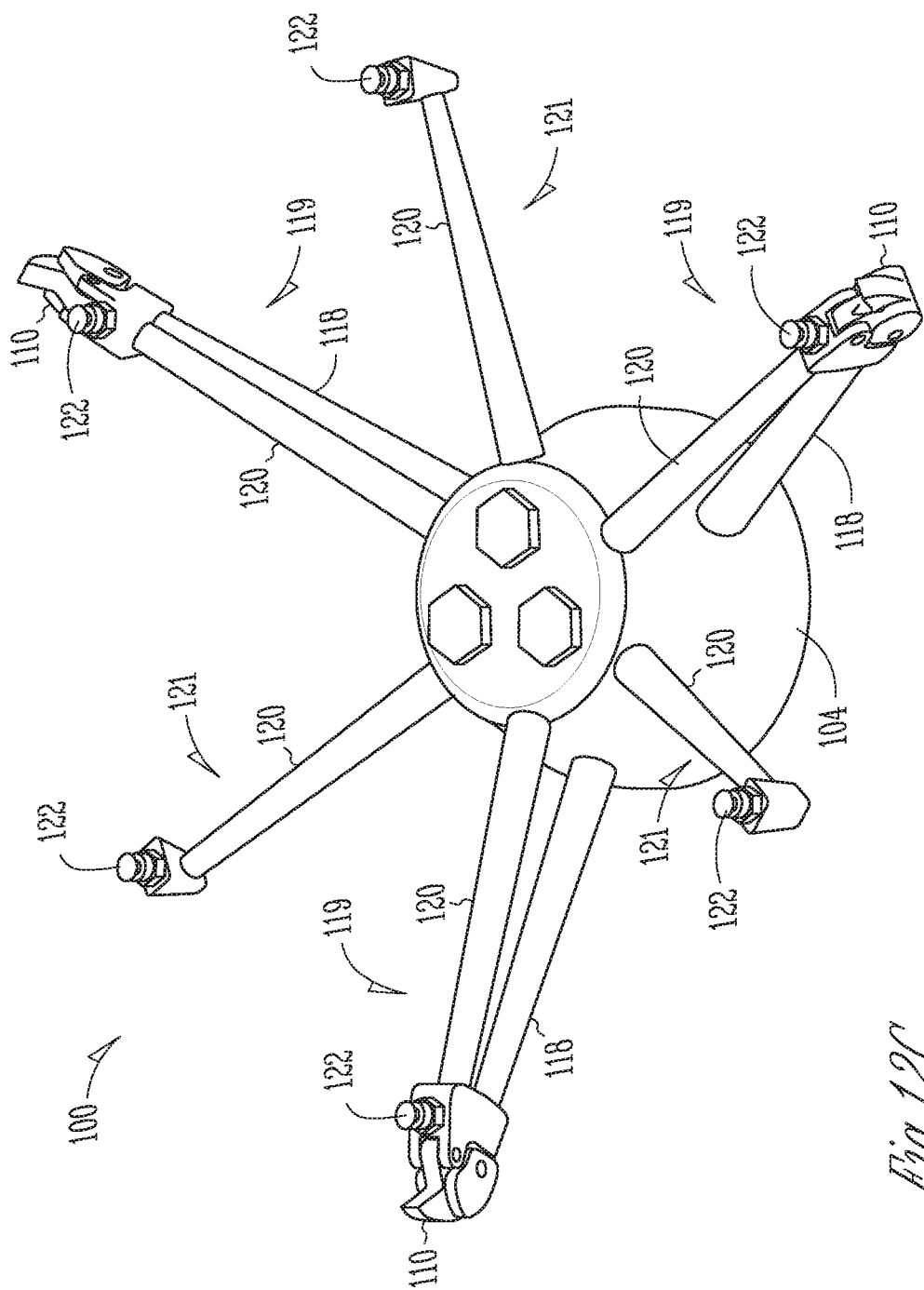
FIG. 12C includes a pictorial view of a chuck assembly and associated components, according to example embodiments.

The series of views in FIGS. 12A-12C seek to provide a convenient visual comparison of certain aspects of the present chuck assembly 100 shown in FIG. 12C with those of a conventional chuck assembly 1200 shown in FIGS. 12A-12B. The chuck assembly 1200 illustrated in FIG. 12A includes centrifugal cams 200 of a centrifugal or passive type, as opposed to an active or positive camming type of the present disclosure. FIG. 12B includes a larger view of VAPs 202 of the centrifugal cams 200. As described more fully in the Background above, the presence of such VAPs 202 can be unhelpful during EBR or when rinsing a wafer 112, for example. A friction (not vacuum) pad 204 is visible adjacent each cam 200.

In contradistinction, FIG. 12C depicts pictorially an example chuck assembly 100 according to example embodiments of the present disclosure. In the illustrated example, three cam-carrying arms 119 are radially equally spaced around a central chuck hub 104. Each arm 119 carries a respective cam 110. Three non-cam-carrying arms 121 are disposed between the cam-carrying arms 119 as shown. Each cam-carrying arm 119 and each non-cam-carrying arm 121 includes a vacuum pad 122 disposed towards an outer end of the arm. In some examples, the vacuum pad 122 is constituted by or includes a vacuum cup. Vacuum pressure may be applied to the vacuum pads 122 to suck or secure a wafer thereto under the negative pressure of the applied vacuum. In the illustrated example, six vacuum pads 122 are provided. Each cam-carrying arm 119 comprises a vacuum supply line 120 and a hollow chuck arm 118 containing a push rod 116 in the manner described above. Other arm arrangements or configurations are possible.

Example chuck assemblies 100 of the type illustrated in FIG. 12C can positively center a wafer after the wafer is handed off to the chuck assembly 100 from a robot. An ability to center a wafer after placement can eliminate or at least significantly reduce the need for precise robot placement of the wafer in the chuck assembly. Different centering configurations may be employed for a range of wafer diameters. Concentricity retention can be achieved by robust centering and elimination of VAPs from the wafer edge. The illustrated chuck assembly 100 can also minimize streaking and taper width by allowing the use of higher-rpm EBR processes and can provide complementary wafer detection using a vacuum grip level, for example.

Figure 13:
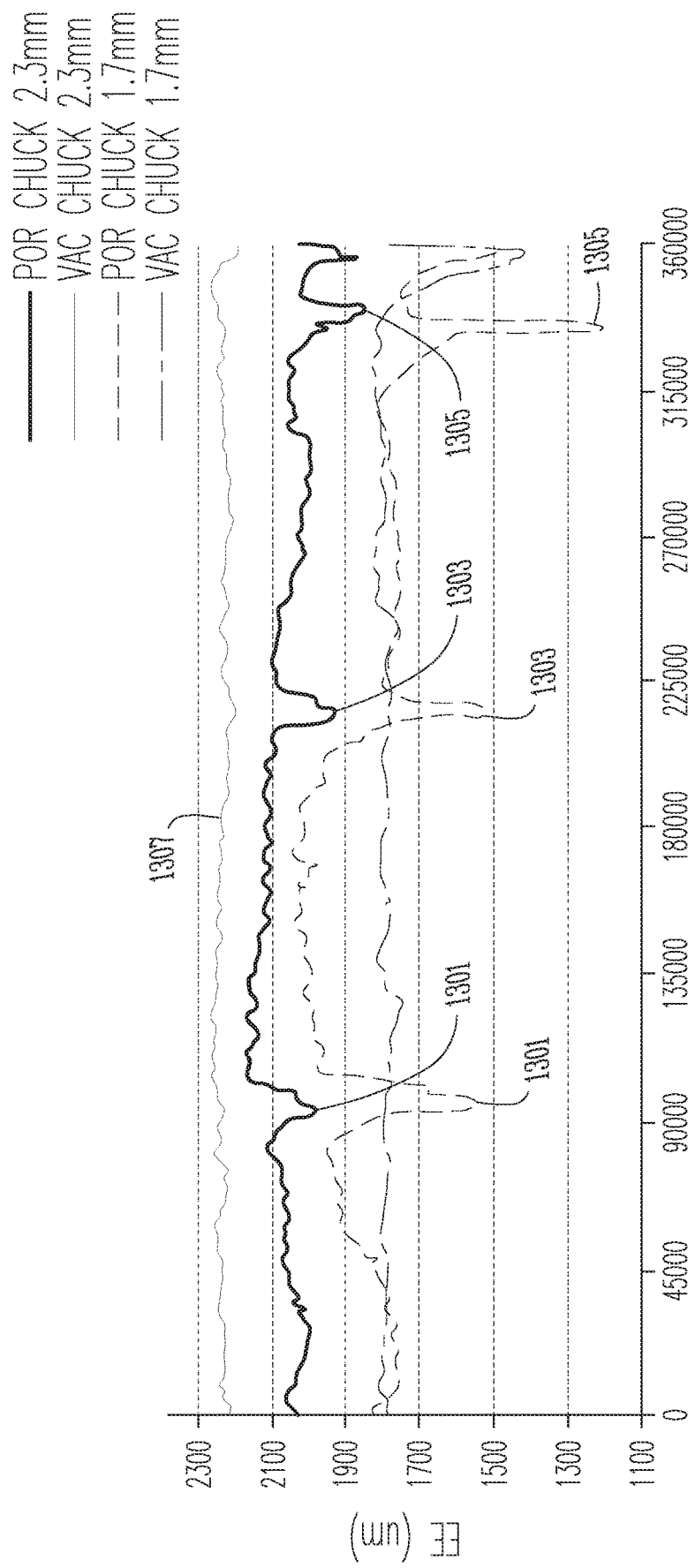
FIG. 13 includes tabled and graphed results for example EBR measurements, according to some example embodiments.

Comparative results to support the efficacy of the features described above were obtained. For example, FIG. 13 provides example graphical results for EBR measurements observed within specified edge exclusion (EE) wafer ranges (here, 1.7 and 2.3 mm) and taken at 360 points of measurement of a tested wafer. EBR results for a conventional point-of-reference (POR) chuck show marked deformities representative of streaks or notches as indicated by sharp downward spikes in the graph at three distinct locations 1301, 1303, and 1305 around the tested wafer. These locations correspond to the presence of a VAP.

By comparison, and as shown for example by a top line 1307 for the present vacuum (VAC) chuck (2.3 mm) in the graph of FIG. 13, very few if any such deformities were exhibited by wafers supported by the present chuck. A similar smoothed result may be seen for the present VAC chuck (1.7 mm). It may be noted that for the conventional POR chucks, the smaller the EE (y-axis), the more extreme the downward spikes in the graph. This is believed to represent an increased effect of the VAPs at the respective locations. The 1.7 mm locations are nearer the outside edge of the wafer than the 2.3 mm locations and more likely to suffer from negative peripheral effects. The comparative range of measured deformity values may be seen in the row marked by a rectangle in the table in the lower right of the view.

Certain embodiments in this disclosure include method embodiments, or processes. In some examples, a method includes a process of wafer centering, wafer gripping, and fluid-obstruction mitigation for producing superior EBR. An example method may include at least the following operations or aspects as described below. The method may be performed for example in conjunction with one or more of the present chuck assemblies described herein, for example a chuck assembly 100 having cams 110 and vacuum pads 122 as shown for example in FIG. 12C.

Figure 16:
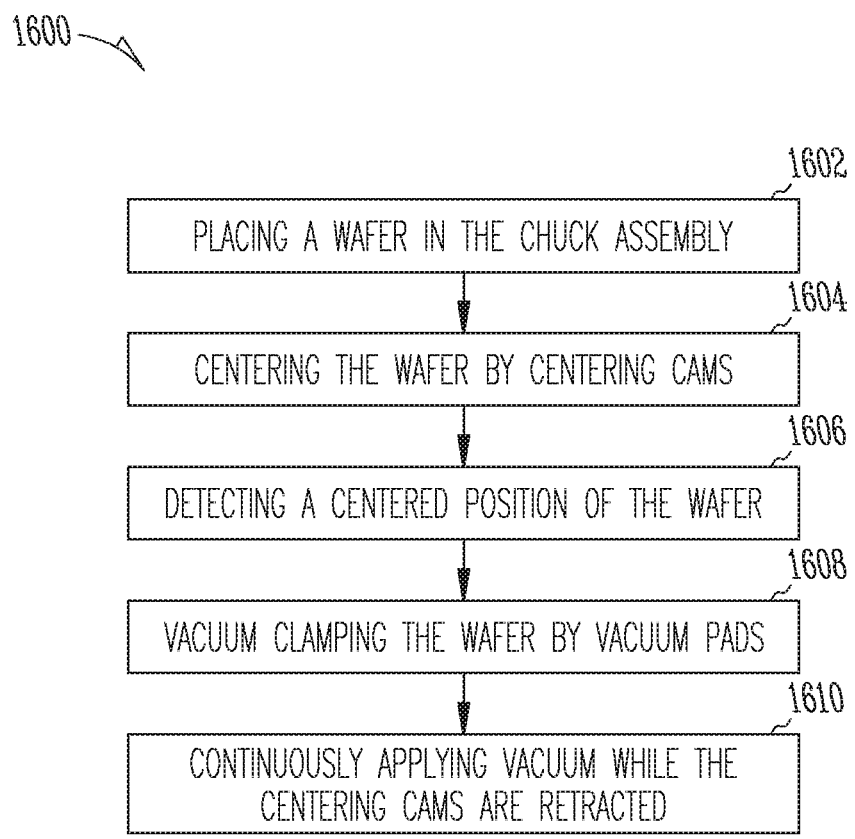
FIG. 16 is a flow chart showing operations in a method, according to an example embodiment.

With reference to FIG. 16, a method 1600 may include at 1602 placing a wafer in the chuck assembly 100. The wafer is centered at 1604 by centering cams 110 as described above. Once a centered position of the wafer is found at 1606 (detected by increased spindle motor torque, for example), the wafer is vacuum clamped at 1608 by the vacuum pads 122 upon which the wafer is located. Vacuum continues to be applied at 1610 while the centering cams 110 are retracted to allow the wafer to remain correctly and concentrically clamped in place.

Occasionally, a vacuum pad may leak when the wafer is distorted by centering cam action. If a wafer fails to vacuum clamp, the method 1600 is aborted because failure to properly vacuum clamp the wafer may indicate that the wafer is broken, cracked, missing, or misplaced and not sitting on all vacuum pads 122.

Assuming a vacuum is sustained, the centering cams 110 are held in the retracted position below the upper surface of the wafer during wafer processing steps, such as EBR, rinsing, or drying steps. Since the centering cams 110 are below the surface of the wafer, EBR chemicals leaving the edge of the wafer due to centrifugal action find no obstacles to reflect against.

In another example, a method for vacuum gripping of a wafer in a wet process chamber is provided. The method may include at least the following operations or address certain aspects as follows.

In some instances, gripping the underside of a wafer in a wet process chamber can be challenging. For example, with a large pressure differential across the surface or lip of a vacuum pad, a degree of fluid leakage can occur such that liquid is drawn into the vacuum circuit. Liquid that enters the vacuum circuit may later exit the vacuum circuit to be deposited onto the underside of the wafer by centrifugal action at the end of an EBR process. As a result, it can be very important for successful wafer processing that no liquid leakage is allowed past an edge or lip of a vacuum pad 122.

Thus, in some examples, a vacuum pad or cup geometry is selected that does not leave wet water rings or permit leakage. Different rubber compounds and hardnesses are possible to properly seal and not leave contamination on the underside of a wafer.

In some examples, a method for determining a wafer centeredness independently of wafer diameter is provided by using a monitored motor torque. The method may include at least the following operations or address certain aspects as follows.

As described above, a motor torque and an encoder position may be codependent on each other and may be measured together to validate a wafer centeredness or concentricity in a wafer chuck. In a chuck assembly 100 of the type described above (for example, with respect to FIG. 3), when the centering cams 110 clamp against a wafer edge, the spindle motor torque spikes, and the high torque is recognized as indicating the wafer clamp position. In some examples, the associated motor encoder position falls within a known window to validate that the chuck has clamped against a 300 mm wafer (for example) when the torque spikes.

In another example, a method for EBR excursion prevention using chuck self-diagnostics is provided. The method may include at least the following operations or address certain aspects as follows. Here, measurements of motor torque and encoder readback allow for the detection of inherent error in centering validation. For example, if a motor torque spikes and the encoder position is outside allowable limits, this indicates a centering error. Some example situations that can cause centering errors include a broken cam, a broken wafer, broken or frozen components, or a motor or encoder failure. The use of aspects such as motor torque and encoder codependency allows centering errors to be detected on a first wafer or early wafer in a series, rather than on a subsequent one. Early corrective action may be taken to prevent EBR excursions on following wafers which may avoid significant waste and avoid major financial loss and waste of time.

In another example, a method for measuring a wafer diameter during centering and providing automatic adjustment of EBR is described. The method may include at least the following operations or address certain aspects as follows. A wafer diameter may be inferred from an encoder readback of a spindle motor torque spike during a wafer centering routine. Wafer diameters can vary, and this can impact edge exclusion parameters. Further variability may include measuring edge exclusion from the wafer edge to etched copper from an EBR process, regardless of the actual wafer diameter. Thus, small changes in wafer diameter allowed by a given specification may lead to changes in measured edge exclusion.

Despite this variability, if a wafer is measured as being abnormally small or large, the wafer diameter can be forwarded to an EBR system. The EBR system may be configured in some examples to automatically adjust the position of the EBR nozzle to maintain a desired edge exclusion based on the applicable basis of the EBR parameters.

In another example, a method for center reference regarding edge detection is provided. The method may include at least the following operations or address certain aspects as follows. In some examples, it may be desired to validate that a copper-plated film diameter on a wafer is the same from wafer to wafer in a batch regardless of the edge exclusion. In some examples, a chuck measures a wafer diameter during a centering routine. EBR metrology measures an edge exclusion post EBR. If the EBR metrology detects a shift in edge exclusion, then the wafer diameter can be determined from the chuck to see if the shift is due to process issues or a change in wafer diameter. If the edge exclusion shift is caused by a wafer diameter change, then the center reference regarding edge detection can be determined not to have changed. Based on the determination, it is concluded that the copper-plated diameter has not changed.

In another example, tool diagnostic and safety features are provided. Some examples use multiple-location vacuum-grip sensors distributed across the underside of a wafer to detect broken or misplaced wafers. This methodology may include the following operations or aspects.

As background, a wafer selected for processing may be defective. For example, a piece of the wafer may have broken off (for example, having a pizza-slice shape). The remaining wafer includes open spaces and may not be gripped in a chuck assembly having, for example, only three vacuum cups spaced 120° around the periphery of the chuck. In this unsecured state, the wafer may violently disintegrate completely or fly off at high speed. By increasing the number of vacuum pads or cups, the detection of smaller missing pieces is improved.

Figure 14:
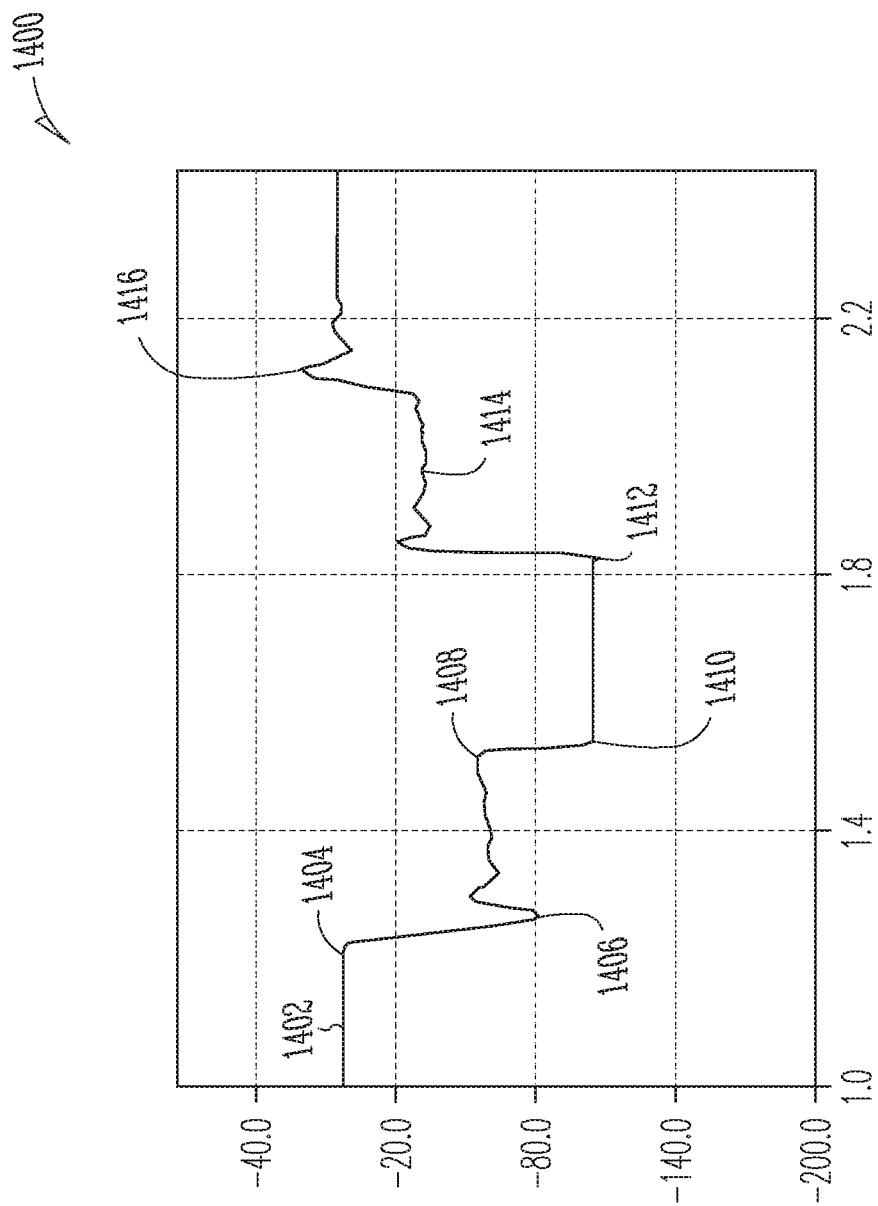
FIG. 14 includes a torque profile of a chuck motor during a centering operation, according to an example embodiment.

With reference to FIG. 14, a motor torque sensing routine for an example chuck assembly 100 is now described with reference to a graph 1400. During centering, a chuck hub of the chuck assembly 100 is moved by a spindle motor in a negative direction (for example, counterclockwise when viewed from above) over an internal temporarily stationary centering hub to actuate centering cams, as described above. The negative rotational direction of the spindle motor may be contrasted with a positive rotational direction employed during processing such as EBR processing (for example, clockwise). Moving in the negative direction, the spindle motor exhibits a negative torque value. The negative values are shown on the y-axis of the graph 1400. A "higher" negative torque has a larger negative value and will be seen at a lower position on the graph 1400.

The graph 1400 of FIG. 14 includes an example torque profile of the spindle motor during the centering step described above. With reference to the graph 1400, in phase 1402, the chuck assembly is spinning before the centering hub fin 134 (described above) hits the locking pin 108, and the torque is very low (~−5% of rated torque). At point 1404, the locking pin 108 engages the fin 134 and the (negative) torque increases. The illustrated results indicate an overshoot and undershoot torque profile at and just after point 1406. The spindle motor torque then settles and maintains a near-constant value until point 1408 while the centering hub 102 is moving relative to the chuck hub 104 to actuate and close the centering cams 110. The cams 110 begin to engage the wafer 112 and move it to the desired center position until point 1408. The motor torque then spikes, implying that the wafer 112 is no longer moving, has reached a centered position where it is somewhat compressed, and is now starting to offer resistance to the centering cams 110. An example motor torque spike is shown at point 1410.

A centering torque magnitude may vary from chuck to chuck due to component variation, tolerance differences, spring rates, and so forth. Calibrating a chuck to determine the torque required to center a 300 mm wafer may address these variations. For example, a cutoff torque in a phase between points 1410 and 1412 can be set appropriately to ensure that a given wafer is not over-compressed or damaged during centering. In phase 1414, the chuck arm springs extend while the cams 110 are retracting. The undershoot and overshoot spike 1416 after phase 1414 occurs when the centering hub fin 134 breaks contact with the locking pin 108.

Figure 15:
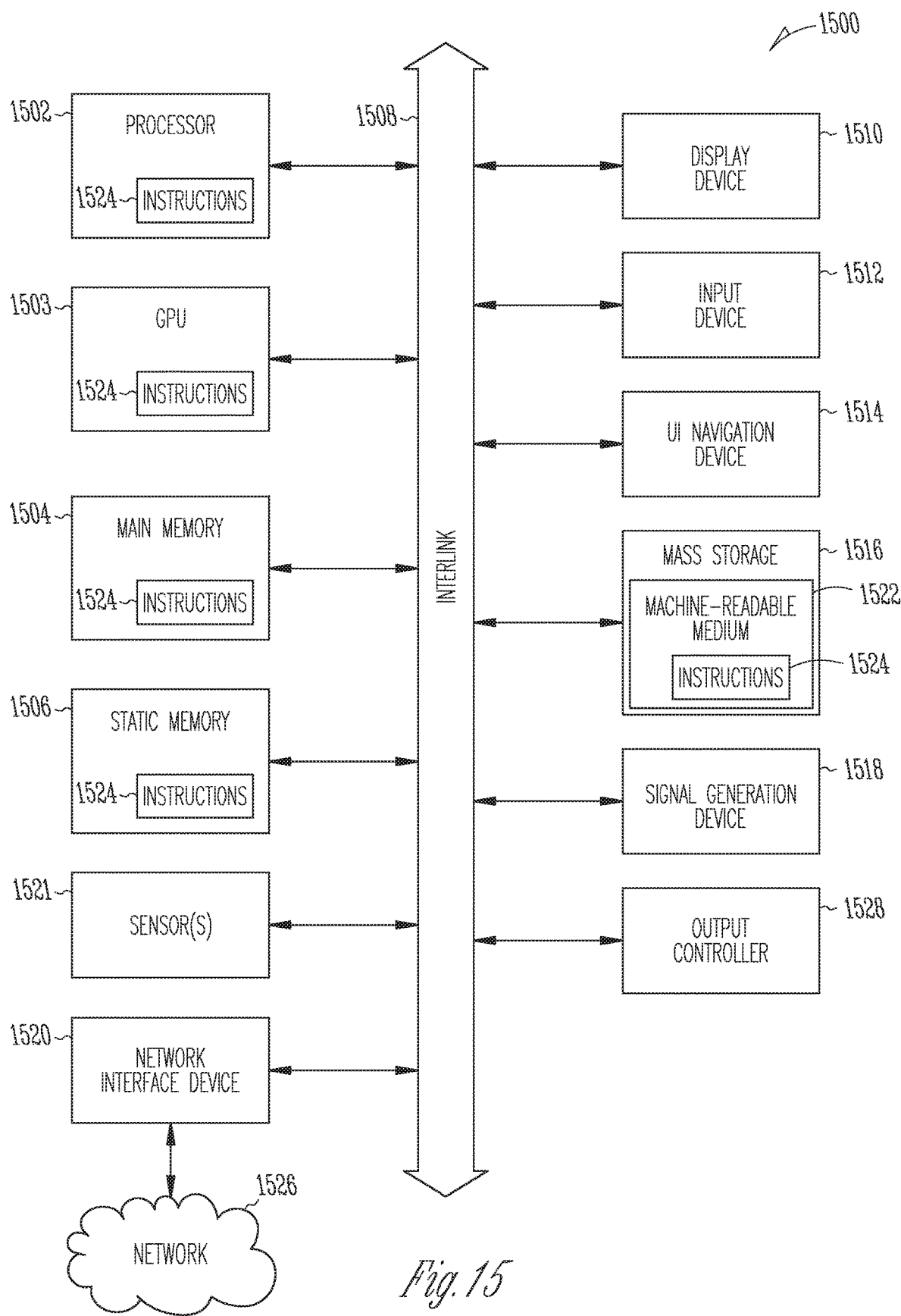
FIG. 15 is a block diagram illustrating an example of a machine upon which one or more example embodiments may be implemented, or by which one or more example embodiments may be controlled.

FIG. 15 is a block diagram illustrating an example of a machine 1500 upon which one or more example method embodiments described herein may be implemented, or by which one or more example method embodiments described herein may be controlled. In alternative embodiments, the machine 1500 may operate as a standalone device or may be connected (e.g., networked) to other machines. In a networked deployment, the machine 1500 may operate in the capacity of a server machine, a client machine, or both in server-client network environments. In an example, the machine 1500 may act as a peer machine in a peer-to-peer (P2P) (or other distributed) network environment. Further, while only a single machine 1500 is illustrated, the term "machine" shall also be taken to include any collection of machines that individually or jointly execute a set (or multiple sets) of instructions to perform any one or more of the methodologies discussed herein, such as via cloud computing, software as a service (SaaS), or other computer cluster configurations.

Examples, as described herein, may include, or may operate by, logic, a number of components, or mechanisms. Circuitry is a collection of circuits implemented in tangible entities that include hardware (e.g., simple circuits, gates, logic, etc.). Circuitry membership may be flexible over time and underlying hardware variability. Circuitries include members that may, alone or in combination, perform specified operations when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a computer-readable medium physically modified (e.g., magnetically, electrically, by moveable placement of invariant massed particles, etc.) to encode instructions of the specific operation. In connecting the physical components, the underlying electrical properties of a hardware constituent are changed (for example, from an insulator to a conductor or vice versa). The instructions enable embedded hardware (e.g., the execution units or a loading mechanism) to create members of the circuitry in hardware via the variable connections to carry out portions of the specific operation when in operation. Accordingly, the computer-readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry, at a different time.

The machine (e.g., computer system) 1500 may include a hardware processor 1502 (e.g., a central processing unit (CPU), a hardware processor core, or any combination thereof), a graphics processing unit (GPU) 1503, a main memory 1504, and a static memory 1506, some or all of which may communicate with each other via an interlink (e.g., bus) 1508. The machine 1500 may further include a display device 1510, an alphanumeric input device 1512 (e.g., a keyboard), and a user interface (UI) navigation device 1514 (e.g., a mouse). In an example, the display device 1510, alphanumeric input device 1512, and UI navigation device 1514 may be a touch screen display. The machine 1500 may additionally include a mass storage device (e.g., drive unit) 1516, a signal generation device 1518 (e.g., a speaker), a network interface device 1520, and one or more sensors 1521, such as a Global Positioning System (GPS) sensor, compass, accelerometer, or another sensor. The machine 1500 may include an output controller 1528, such as a serial (e.g., universal serial bus (USB)), parallel, or other wired or wireless (e.g., infrared (IR), near field communication (NFC), etc.) connection to communicate with or control one or more peripheral devices (e.g., a printer, card reader, etc.).

The mass storage device 1516 may include a machine-readable medium 1522 on which is stored one or more sets of data structures or instructions 1524 (e.g., software) embodying or utilized by any one or more of the techniques or functions described herein. The instructions 1524 may also reside, completely or at least partially, within the main memory 1504, within the static memory 1506, within the hardware processor 1502, or within the GPU 1503 during execution thereof by the machine 1500. In an example, one or any combination of the hardware processor 1502, the GPU 1503, the main memory 1504, the static memory 1506, or the mass storage device 1516 may constitute machine-readable media.

While the machine-readable medium 1522 is illustrated as a single medium, the term "machine-readable medium" may include a single medium or multiple media (e.g., a centralized or distributed database, and/or associated caches and servers) configured to store the one or more instructions 1524.

The term "machine-readable medium" may include any medium that can store, encode, or carry the instructions 1524 for execution by the machine 1500 and that cause the machine 1500 to perform any one or more of the techniques of the present disclosure, or that can store, encode, or carry data structures used by or associated with such instructions 1524. Non-limiting machine-readable medium examples may include solid-state memories, and optical and magnetic media. In an example, a massed machine-readable medium comprises a machine-readable medium 1522 with a plurality of particles having invariant (e.g., rest) mass. Accordingly, massed machine-readable media are not transitory propagating signals. Specific examples of massed machine-readable media may include non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks. The instructions 1524 may further be transmitted or received over a communications network 1526 using a transmission medium via the network interface device 1520.

Although an embodiment has been described with reference to specific example embodiments, it will be evident that various modifications and changes may be made to these embodiments without departing from the broader spirit and scope of the inventive subject matter. Accordingly, the specification and drawings are to be regarded in an illustrative rather than a restrictive sense. The accompanying drawings that form a part hereof, show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover all adaptations or variations of various embodiments. Combinations of the above embodiments, and other embodiments not specifically described herein, will be apparent to those of skill in the art upon reviewing the above description.

What is claimed is:

1. A vacuum wafer chuck assembly for supporting a wafer, the chuck assembly comprising:
    a chuck hub;
    a centering hub disposed rotationally within the chuck hub;
    a plurality of chuck arms mounted to the chuck hub, each chuck arm extending radially between a proximal end adjacent the chuck hub, and a distal end remote therefrom;
    a plurality of centering cams each mounted at or towards a distal end of a chuck arm and being movable radially inwardly or outwardly relative to the centering hub to engage or release an edge of a supported wafer in response to a rotational movement of the centering hub; and
    at least one vacuum pad provided at or towards a distal end of a chuck arm for supporting the wafer during a wafer centering or wafer processing operation.

2. The wafer chuck assembly of claim 1, further comprising:
    an engagement device operable between an engaged position and a disengaged position respectively to engage the chuck hub with the centering hub to prevent relative movement therebetween in one of a clockwise or anticlockwise rotational direction, or to allow relative movement therebetween in either rotational direction; and
    a chuck motor for selectively rotating the chuck hub and/or the centering hub during a wafer processing operation and a wafer centering operation based on the engaged or disengaged position of the engagement device.

3. The wafer chuck assembly of claim 2, wherein the chuck motor is configured to impart relative rotational movement between the centering hub and the chuck hub during the wafer centering operation.

4. The wafer chuck assembly of claim 3, wherein the centering hub is fixed relative to the chuck motor during the wafer centering operation, and the chuck motor is configured to cause the chuck hub to rotate in a first rotational direction during the wafer centering operation.

5. The wafer chuck assembly of claim 4, wherein the chuck motor is configured to rotate the centering hub and the chuck hub together in a same rotational direction during the wafer processing operation.

6. The wafer chuck assembly of claim 5, wherein the same rotational direction of the centering hub and the chuck hub during the wafer processing operation is opposite to the first rotational direction of the chuck hub during the wafer centering operation.

7. The wafer chuck assembly of claim 2, wherein the centering hub includes at least one camming surface on an exterior surface thereof.

8. The wafer chuck assembly of claim 7, wherein each chuck arm includes a respective elongate actuation rod operationally disposed between the at least one camming surface of the centering hub, and a centering cam disposed at a distal end of each chuck arm of the plurality of centering cams.

9. The wafer chuck assembly of claim 8, wherein each elongate actuation rod includes, at a proximal end thereof, a bearing surface for engaging the at least one camming surface of the centering hub.

10. The wafer chuck assembly of claim 9, wherein each elongate actuation rod includes, at the distal end thereof, a link with a respective centering cam of a respective chuck arm.

11. The wafer chuck assembly of claim 10, wherein rotational movement of the centering hub causes a respective camming surface of the centering hub to urge a respective elongate actuation rod radially outwardly, thereby to operate a respective centering cam via the link.

12. The wafer chuck assembly of claim 2, wherein the at least one vacuum pad is configured to retain the wafer in a centered position in the wafer chuck assembly at least during the wafer processing operation when the wafer has been released by the plurality of centering cams.

13. The wafer chuck assembly of claim 2, wherein the at least one vacuum pad is provided on at least one of the plurality of chuck arms.

14. The wafer chuck assembly of claim 2, wherein each of the plurality of chuck arms comprises a vacuum line for supplying vacuum pressure to the at least one vacuum pad.

15. The wafer chuck assembly of claim 14, wherein a vacuum pressure supplied to the at least one vacuum pad serves to vacuum clamp the wafer to the at least one vacuum pad, and wherein a detected failure to vacuum clamp the wafer to the at least one vacuum pad provides an indication that the wafer is broken, cracked, missing, or misplaced on the least one vacuum pad.

16. The wafer chuck assembly of claim 2, wherein the plurality of centering cams is biased towards an open, wafer-release configuration.

17. The wafer chuck assembly of claim 2, wherein each centering cam in the plurality of centering cams is movable between a first, wafer-centering position and a second, retracted position, the second retracted position disposed below an upper surface of the wafer supported in the wafer chuck assembly.

18. The wafer chuck assembly of claim 17, further comprising control means for detecting a torque of the chuck motor and correlating the detected chuck motor torque with at least the first, wafer-centering position of the plurality of centering cams.

19. The wafer chuck assembly of claim 2, further comprising control means for detecting a torque of the chuck motor and correlating the detected chuck motor torque with a centered position of the wafer held in the wafer chuck assembly.

* * * * *